United States Patent
Wang et al.

(10) Patent No.: US 9,842,802 B2
(45) Date of Patent: Dec. 12, 2017

(54) INTEGRATED CIRCUIT DEVICE FEATURING AN ANTIFUSE AND METHOD OF MAKING SAME

(71) Applicant: QUALCOMM Incorporated, San Diego, CA (US)

(72) Inventors: Zhongze Wang, San Diego, CA (US); John Jianhong Zhu, San Diego, CA (US); Xia Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/227,415

(22) Filed: Mar. 27, 2014

(65) Prior Publication Data

US 2014/0210043 A1 Jul. 31, 2014

Related U.S. Application Data

(63) Continuation-in-part of application No. 13/684,107, filed on Nov. 21, 2012, now Pat. No. 9,502,424.
(Continued)

(51) Int. Cl.
*H01L 21/82* (2006.01)
*H01L 27/112* (2006.01)
(Continued)

(52) U.S. Cl.
CPC .......... *H01L 23/5252* (2013.01); *G11C 17/16* (2013.01); *H01L 23/5228* (2013.01);
(Continued)

(58) Field of Classification Search
CPC ... H01L 23/5252; H01L 21/768; H01L 28/24; H01L 27/11206; H01L 27/11286; H01L 23/5228; H01L 2924/0002; G11C 17/16
(Continued)

(56) References Cited

U.S. PATENT DOCUMENTS

| | | | |
|---|---|---|---|
| 5,583,819 A | | 12/1996 | Roesner et al. |
| 6,096,580 A | * | 8/2000 | Iyer ..................... H01L 23/5252 257/E23.147 |

(Continued)

FOREIGN PATENT DOCUMENTS

| | | |
|---|---|---|
| CN | 101180684 A | 5/2008 |
| CN | 101621034 A | 1/2010 |

(Continued)

OTHER PUBLICATIONS

Zhenkun Ren, "The Sputtered AuPtlTi Thin Film Stack for GaAs Metallization: Microstructure, Stress, and Surface Roughness", Oct. 2004, pp. 27-36.*

(Continued)

*Primary Examiner* — Marcos D Pizarro
*Assistant Examiner* — Nelson Garces
(74) *Attorney, Agent, or Firm* — Loza & Loza LLP

(57) ABSTRACT

One feature pertains to an integrated circuit that includes an antifuse having a conductor-insulator-conductor structure. The antifuse includes a first conductor plate, a dielectric layer, and a second conductor plate, where the dielectric layer is interposed between the first and second conductor plates. The antifuse transitions from an open circuit state to a closed circuit state if a programming voltage $V_{pp}$ greater than or equal to a dielectric breakdown voltage $V_{BD}$ of the antifuse is applied to the first conductor plate and the second conductor plate. The first conductor plate has a total edge length that is greater than two times the sum of its maximum width and maximum length dimensions. The first conductor plate's top surface area may also be less than the product of its maximum length and maximum width.

20 Claims, 32 Drawing Sheets

Related U.S. Application Data

(60) Provisional application No. 61/666,649, filed on Jun. 29, 2012.

(51) Int. Cl.
    *H01L 21/8239* (2006.01)
    *H01L 23/525* (2006.01)
    *G11C 17/16* (2006.01)
    *H01L 23/522* (2006.01)
    *H01L 49/02* (2006.01)

(52) U.S. Cl.
    CPC .. *H01L 27/11206* (2013.01); *H01L 27/11286* (2013.01); *H01L 28/24* (2013.01); *H01L 2924/0002* (2013.01)

(58) Field of Classification Search
    USPC .................................................. 257/525–535
    See application file for complete search history.

(56) References Cited

U.S. PATENT DOCUMENTS

| | | | |
|---|---|---|---|
| 7,180,361 B2 | 2/2007 | Takai | |
| 7,280,425 B2 | 10/2007 | Keshavarzi et al. | |
| 7,301,436 B1* | 11/2007 | Hopper | H01L 23/5228 257/E23.02 |
| 8,223,526 B2 | 7/2012 | Kurjanowicz | |
| 2003/0201514 A1* | 10/2003 | Radens | H01L 23/5252 257/530 |
| 2004/0087098 A1 | 5/2004 | Ng et al. | |
| 2005/0035429 A1 | 2/2005 | Yeh et al. | |
| 2006/0097325 A1 | 5/2006 | Yang et al. | |
| 2006/0181927 A1 | 8/2006 | Pesavento et al. | |
| 2006/0221698 A1 | 10/2006 | Obuchi | |
| 2007/0241423 A1* | 10/2007 | Taylor | H01L 23/5223 257/530 |
| 2008/0012138 A1 | 1/2008 | Wang et al. | |
| 2008/0179685 A1 | 7/2008 | Petti | |
| 2009/0026577 A1 | 1/2009 | Ogawa | |
| 2009/0086521 A1* | 4/2009 | Herner | G11C 11/5685 257/530 |
| 2009/0189248 A1 | 7/2009 | Kitamura et al. | |
| 2009/0250726 A1 | 10/2009 | Kurjanowicz | |
| 2010/0001330 A1 | 1/2010 | Chien et al. | |
| 2011/0254122 A1 | 10/2011 | Noda et al. | |
| 2011/0309472 A1* | 12/2011 | Nakaiso | H01L 23/5252 257/530 |
| 2012/0061796 A1* | 3/2012 | Wang | H01L 23/522 257/530 |
| 2012/0112313 A1* | 5/2012 | Tani | H01L 23/5252 257/530 |
| 2014/0001568 A1 | 1/2014 | Wang et al. | |
| 2014/0070364 A1 | 3/2014 | Park et al. | |

FOREIGN PATENT DOCUMENTS

| | | |
|---|---|---|
| JP | H11150187 A | 6/1999 |
| JP | 2005142531 A | 6/2005 |
| JP | 2006245177 A | 9/2006 |
| JP | 2009049211 A | 3/2009 |
| JP | 2011187472 A | 9/2011 |
| WO | 2005109516 A1 | 11/2005 |
| WO | 2006107384 A1 | 10/2006 |
| WO | 2006126110 A1 | 11/2006 |

OTHER PUBLICATIONS

International Search Report and Written Opinion—PCT/US2015/023031—ISA/EPO—dated Jun. 12, 2015.
International Search Report and Written Opinion—PCT/US2013/048088—ISA/EPO—dated Feb. 3, 2014.
Partial International Search Report—PCT/US2013/048088—ISA/EPO—dated Sep. 18, 2013.

* cited by examiner

INTEGRATED CIRCUIT DEVICE FEATURING AN ANTIFUSE AND METHOD OF MAKING SAME

CLAIM OF PRIORITY

The present application for patent claims priority to and is a continuation-in-part of U.S. patent application Ser. No. 13/684,107 entitled "Integrated Circuit Device Featuring an Antifuse and Method of Making Same" filed Nov. 21, 2012, which in turn claims priority to U.S. Provisional Patent Application No. 61/666,649 entitled "Integrated Circuit Device Featuring an Anti-fuse" filed Jun. 29, 2012, the entire disclosures of which are hereby expressly incorporated by reference herein.

BACKGROUND

Field

Various features relate to integrated circuits, and more particularly to methods and apparatuses for improved programmable memory cells featuring antifuses.

Background

Integrated circuits are interconnected networks of electrical components fabricated on a common foundation called a substrate. The substrate is typically a wafer of semiconductor material, such as silicon. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. As another example, fusible elements may be used to create one time programmable (OTP) or multi-time programmable (MTP) memory circuits. Individual memory cells of an OTP memory cell may be written to once in order to create read only memory modules that cannot be easily altered and/or are secure.

One type of fusible element is a metal fuse. The metal fuse is composed of a metal alloy or metal, such as copper, that may change its state from a conductive, closed circuit state to a substantially non-conductive, open circuit state if a sufficient amount of current flows through the metal fuse. Metal fuses have several disadvantages. For example, the current needed to program the fuse (i.e., blow the fuse to change it from a closed circuit state to an open circuit state) is relatively high. Generating this current consumes a substantial amount of power, particularly for mobile devices where power consumption is a concern. Moreover, relatively large transistors (i.e., transistors having a large chip area) are required to generate the current drive needed to blow the metal fuses. Furthermore, the integrated circuit package having the metal fuses may require a dedicated power pin to handle the high current used for programming the metal fuses. Additionally, metal fuses provide poor security because the blown fuses may, in some cases, be seen optically. Also, metal fuses offer poor reliability and in some cases may require serial programming.

Another type of fusible element is a gate dielectric antifuse. An antifuse comprises two conductive terminals separated by an insulator or a dielectric, and is fabricated as an open circuit. The antifuse is programmed by applying a high voltage across its terminals to rupture the insulator and form an electrical path between the terminals. Typical prior art gate dielectric antifuses used for programmable memory cells require a high voltage to change the state of the antifuse from an open circuit state to a closed circuit state. The voltage needed to cause the state change is generated using a charge pump. However, charge pumps consume a substantial amount of the integrated circuit's active chip area that may otherwise be used for other active components, such as memory cells.

Therefore, there exists a need for integrated circuits, such as OTP and MTP memory cells, that feature fusible elements that do not suffer from the disadvantages described above in connection with metal fuses and gate dielectric fuses.

There also exists a need for integrated circuits having antifuses that can transition from open circuit states to closed circuit states at lower programming voltages.

SUMMARY

One feature provides an integrated circuit comprising an antifuse having a conductor-insulator-conductor structure. The antifuse including a first conductor plate, a dielectric layer, and a second conductor plate, where the dielectric layer is interposed between the first and second conductor plates, and the antifuse is configured to transition from an open circuit state to a closed circuit state if a programming voltage $V_{pp}$ greater than or equal to a dielectric breakdown voltage $V_{BD}$ of the antifuse is applied to the first conductor plate and the second conductor plate. The first conductor plate has a maximum width $W_{MAX}$ and a maximum length $L_{MAX}$, and the first conductor plate has a total edge length $L_{TE}$ according to an equation given by $L_{TE} > 2*(W_{MAX} + L_{MAX})$. According to one aspect, the first conductor plate includes a first body portion having a first side, and a first plurality of fingers extending laterally from the first side of the first body portion, the first plurality of fingers each being rectangular and having a length $L_F$ and positioned perpendicular lengthwise to the first side of the first body portion. According to another aspect, the number of the first plurality of fingers is equal to N, and the total edge length $L_{TE}$ of the first conductor plate is given by an equation $L_{TE} = 2*(W_{MAX} + L_{MAX}) + 2*(N-1)*L_F$.

According to one aspect, the first conductor plate further includes a second plurality of fingers extending laterally from a second side of the first body portion, the second side of the first body portion opposite the first side of the first body portion, the second plurality of fingers each being rectangular and having a length $L_F$ and positioned perpendicular lengthwise to the second side of the first body portion. According to another aspect, the number of the first plurality of fingers is equal to the number of the second plurality of fingers and the total number of the first and second plurality of fingers is equal to N, and the total edge length $L_{TE}$ of the first conductor plate is given by an equation $L_{TE} = 2*(W_{MAX} + L_{MAX}) + 2*(N-2)*L_F$. According to yet another aspect, the number of the first plurality of fingers is greater than the number of the second plurality of fingers and the total number of the first and second plurality of fingers is odd and equal to N, and the total edge length $L_{TE}$ of the first conductor plate is given by an equation $L_{TE} = 2*(W_{MAX} + L_{MAX}) + 2*(N-2)*L_F$.

According to one aspect, the first conductor plate further includes a second body portion having a second side, and the first plurality of fingers also extend laterally from the second side of the second body portion to couple the first and second body portions to each other. According to another aspect, the number of the first plurality of fingers is equal to N, the first plurality of fingers are spaced apart a distance $W_S$, and the total edge length $L_{TE}$ of the first conductor plate is given by an equation $L_{TE}=2*(W_{MAX}+L_{MAX})+2*(N-1)*(L_F+W_S)$. According to yet another aspect, the first conductor plate further includes a second body portion having a second plurality of fingers, the first body portion not directly coupled to the second body portion.

According to one aspect, the second body portion has a second side, and the second plurality of fingers extend laterally from the second side of the second body portion towards the first body portion, the second plurality of fingers each being rectangular and having a length $L_{F2}$ and positioned perpendicular lengthwise to the second side of the second body portion, and the distance between a distal edge of the second plurality of fingers and the first edge of the first body portion is $L_S$. According to another aspect, the number of the first plurality of fingers is one (1) less than the number of the second plurality of fingers and the total number of the first and second plurality of fingers is odd and equal to N, the distance $L_S$ is equal to about half the length $L_F$ and the length $L_{F2}$, and the total edge length $L_{TE}$ of the first conductor plate is given by an equation $L_{TE}=2*(L_{MAX}+W_{MAX})+(N-2)*L_{F1}+(N-1)*L_{F2}+(N-1)*W_{F1}+(N+1)*W_{F2}+2*(N-1)*W_S$.

According to one aspect, the first conductor plate is positioned above the second conductor plate, and the integrated circuit further comprises: at least one metal line positioned under the second conductor plate. According to another aspect, the metal line includes an edge hump along its edges that causes irregularity and/or surface roughness in at least a portion of the dielectric layer. According to yet another aspect, the first conductor plate is positioned above the second conductor plate, and the integrated circuit further comprises a plurality of metal lines each oriented parallel to one another and having a length greater than at least one of the maximum length $L_{MAX}$ and/or the maximum width $W_{MAX}$ of the first conductor plate.

Another feature provides a method of manufacturing an integrated circuit, the method comprising providing a substrate, forming an antifuse on the substrate by forming a bottom conductor plate on the substrate, forming a dielectric layer above the bottom conductor plate, and forming a top conductor plate above the dielectric layer, the top conductor plate having a maximum width $W_{MAX}$, a maximum length $L_{MAX}$, and a total edge length $L_{TE}$ according to an equation given by $L_{TE}>2*(W_{MAX}+L_{MAX})$. According to one aspect, the method further comprises forming at least one metal line below the bottom conductor plate. According to another aspect, the metal line includes an edge hump along its edges that causes irregularity and/or surface roughness in at least a portion of the dielectric layer.

According to one aspect, the method further comprises forming a plurality of metal lines below the bottom conductor plate, and orienting the metal lines parallel to one another, each metal line having a length greater than at least one of the maximum length $L_{MAX}$ and/or the maximum width $W_{MAX}$ of the top conductor plate. According to another aspect, the antifuse is configured to transition from an open circuit state to a closed circuit state if a programming voltage $V_{pp}$ greater than or equal to a dielectric breakdown voltage $V_{BD}$ of the antifuse is applied to the top conductor plate and the bottom conductor plate. According to yet another aspect, the method further comprises forming the top conductor plate such that the top conductor plate includes a first body portion having a first side, and a first plurality of fingers extending laterally from the first side of the first body portion.

According to one aspect, the method further comprises forming the top conductor plate such that the top conductor plate further includes a second plurality of fingers extending laterally from a second side of the first body portion, the second side of the first body portion opposite the first side of the first body portion. According to another aspect, the method further comprises forming the top conductor plate such that the top conductor plate further includes a second body portion having a second side, and the first plurality of fingers also extend laterally from the second side of the second body portion to couple the first and second body portions to each other. According to yet another aspect, the method further comprises forming the top conductor plate such that the top conductor plate further includes a second body portion having a second side, and a second plurality of fingers extend laterally from the second side of the second body portion towards the first body portion.

Another feature provides an integrated circuit comprising an antifuse including a first conductor plate, a dielectric layer, and a second conductor plate, the dielectric layer interposed between the first and second conductor plates, the antifuse configured to transition from an open circuit state to a closed circuit state if a programming voltage $V_{pp}$ greater than or equal to a dielectric breakdown voltage $V_{BD}$ of the antifuse is applied between the first conductor plate and the second conductor plate, and wherein the first conductor plate has a maximum width $W_{MAX}$ along a first axis, and a maximum length $L_{MAX}$ along a second axis, the first axis and the second axis perpendicular to one another, and the first conductor plate has a total edge length $L_{TE}$ according to an equation given by $L_{TE}>2*(W_{MAX}+L_{MAX})$, and the first conductor plate has a top surface having an area $S_{TP}$ that is less than $W_{MAX}*L_{MAX}$. According to one aspect, the first conductor plate is positioned above the second conductor plate, and the integrated circuit further comprises a plurality of metal lines each oriented parallel to one another and having a length greater than at least one of the maximum length $L_{MAX}$ and/or the maximum width $W_{MAX}$ of the first conductor plate. According to another aspect, the first conductor plate is positioned above the second conductor plate, and the integrated circuit further comprises at least one metal line positioned under the second conductor plate, the metal line including an edge hump along its edges that causes irregularity and/or surface roughness in at least a portion of the dielectric layer. According to yet another aspect, the top conductor plate includes a first body portion having a first side, and a first plurality of fingers extending laterally from the first side of the first body portion.

According to one aspect, the top conductor plate further includes a second plurality of fingers extending laterally from a second side of the first body portion, the second side of the first body portion opposite the first side of the first body portion. According to another aspect, the top conductor plate further includes a second body portion having a second side, and the first plurality of fingers also extend laterally from the second side of the second body portion to couple the first and second body portions to each other. According to yet another aspect, the top conductor plate further includes a second body portion having a second side, and a second plurality of fingers extend laterally from the second side of the second body portion towards the first body portion.

DETAILED DESCRIPTION

Figure 1:
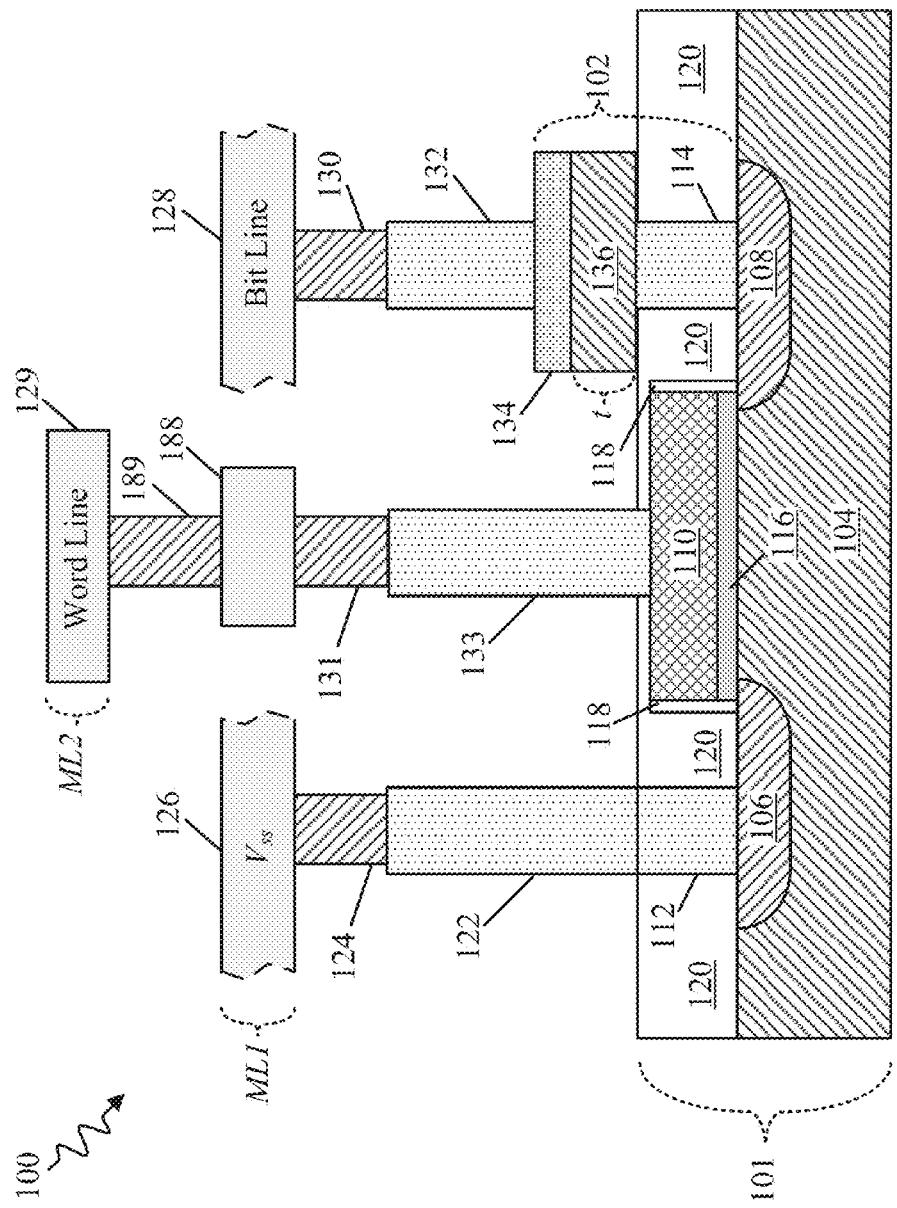
FIG. 1 illustrates a first exemplary cross-sectional, schematic view of an integrated circuit programmable memory cell featuring an antifuse.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "electrically coupled" is used herein to refer to the direct or indirect coupling between two objects that allows for the flow of electrical current to take place between the two objects. For example, if object A physically touches object B, and object B physically touches object C, then objects A and C may still be considered electrically coupled to one another—even if they do not directly physically touch each other—if object B is a conductor that allows for the flow of electrical current from object A to object C and/or from object C to object A.

The terms wafer and substrate may be used herein to include any structure having an exposed surface with which to form an integrated circuit (IC) according to aspects of the present disclosure. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art. The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "above," "below," "on," "upper," "side," "higher," "lower," "over," and "under" when used with respect to the integrated circuits and/or antifuses described herein are defined with respect to the conventional plane or surface being on the top/active surface of the wafer or substrate, regardless of the orientation of the wafer or substrate. The prepositions "above," "below," "on," "upper," "side," "higher," "lower," "over," and "under" are thereby defined with respect to "horizontal" and "vertical."

The terms "source" and "drain" refer generally to the terminals or diffusion regions of a field effect transistor. A terminal or a diffusion region may be more specifically described as a "source" or a "drain" on the basis of a voltage applied to it when the field effect transistor is in operation. P-type conductivity is conductivity associated with holes in a semiconductor material, and n-type conductivity is conductivity associated with electrons in a semiconductor material.

FIG. 1 illustrates a cross-sectional, schematic view of an integrated circuit programmable memory cell 100 featuring an antifuse 102 according to one aspect. The programmable memory cell 100 may be, for example, a one-time programmable (OTP) memory cell. In other aspects of the disclosure, the memory cell 100 may be a multi-time programmable (MTP) memory cell, such as resistive random access memory (RRAM or ReRAM).

The memory cell 100 includes a field effect transistor 101 formed on a semiconductor substrate 104. The transistor 101 includes a source 106 terminal, a drain 108 terminal, and a gate 110 terminal. The substrate 104 acts as the body of the transistor 101 and maybe, for example, a p-type semiconductor. In one aspect, the substrate 104 may actually be a p-type well within another semiconductor substrate. The source 106 and the drain 108 may be n-type semiconductor regions within the p-type substrate body 104, and the gate 110 may be composed of a conductor, such as metal. By controlling the voltages applied to the source 106, the drain 108, the gate 110, and the body 104 relative to one another, the current flow through the transistor 101 (i.e., the current flow between the source 106 and the drain 108) is also controlled. For example, a gate-source voltage ($V_{GS}$) that exceeds the threshold voltage ($V_{TH}$) of the transistor 101 causes an inversion layer (not shown) to form at the interface between the body 104 and a gate dielectric 116 below the gate 110 that allows current to flow between the source 106 and the drain 108. Although the illustrated example shows an n-type channel transistor (e.g., NMOS), the same concepts presented herein equally apply to p-type channel transistors (e.g., PMOS) with the polarity of the voltages and currents modified where appropriate.

As illustrated in FIG. 1, a conductive ohmic source contact 112 electrically couples to the source 106, and another conductive ohmic drain contact 114 electrically couples to the drain 108. The contacts 112, 114 may be composed of a metal, such as tungsten or a tungsten alloy. A gate dielectric 116 lies between the conductive metal gate 110 and the substrate body 104. The gate dielectric 116 may be, but is not limited to, silicon dioxide or a high-K dielectric material such as hafnium silicate, zirconium silicate, and/or hafnium dioxide. The gate 110 may have one or more spacers 118 on its sides. An insulating layer 120, such as silicon nitride, may cover the source 106, the drain 108, and the gate 110.

The source contact 112 may be electrically coupled to a source interconnect 122, which in turn may be electrically coupled to a first metal trace 126 through a vertical interconnect access (via) 124. According to one aspect, the first metal trace 126 may be associated with a first metal layer ML1 and may be electrically coupled to ground ($V_{ss}$).

By contrast to the transistor's source 106 that has an electrically conductive path between the source contact 112 and the first metal trace 126, the transistor's drain 108 does not necessarily have a low resistance electrically conductive path between the drain contact 114 and a second metal trace 128. Instead, an antifuse 102 is interposed in the path between the second metal trace 128 and the drain contact 114, which may be in either an "open" non-conductive state or in a "closed" conductive state. According to one aspect, the second metal trace 128 is associated with the first metal layer ML1, and is electrically coupled to the memory bit line (BL). According to the example shown, the second metal trace 128 is electrically coupled to a via 130, which in turn is electrically coupled to the drain interconnect 132.

In the illustrated example, the antifuse 102 lies between drain contact 114 and a drain interconnect 132. However, in other examples the antifuse 102 may lie between the drain interconnect 132 and the via 130, or between the via 130 and the second metal 128. According to one aspect, regardless of whether the antifuse 102 is positioned between the drain contact 114 and the drain interconnect 132, the drain interconnect 132 and the via 130, or the via 130 and the second metal trace 128, the antifuse 102 may be positioned such that it is generally above the drain 108 of the transistor 101 (or above the source 106 of the transistor, see FIGS. 4 and 5). That is, at least a portion of the antifuse 102 may be positioned in a region or space that is above the drain 108, an example of which is shown in FIG. 1. According to one aspect, the antifuse 102 is positioned, at least in part, in a same vertical plane as the drain region 108 as shown in FIG. 1.

The gate 110 may be electrically coupled to a third metal trace 129 associated with a second metal layer ML2 that is in turn electrically coupled to the word line (WL). There may be a via 131 and/or an interconnect 133 that electrically couples the gate 110 to a trace 188 associated with the first metal layer ML1. The trace 188 may be in turn electrically coupled to the third trace 188 through a via 189. The metals traces 126, 128, 129, 188, the interconnects 122, 132, 133, the vias 124, 130, 131, 189 and the antifuse 102 may all be encased in an insulating material (not shown).

The antifuse 102 includes an antifuse dielectric 136. The antifuse 102 may also include a conductive top electrode 134 (e.g., "first electrode") that is electrically coupled to the top side of the antifuse dielectric 136. According to one aspect, the antifuse 102 also includes a conductive bottom element that is electrically coupled to the bottom side of the dielectric 136. According to one example, the conductive bottom element may include the source contact 112 or the drain contact 114. According to other examples, the conductive bottom element may include the source interconnect 122, the via 124, the drain interconnect 132, and the via 130. In this fashion, the antifuse 102 has a conductor-insulator-conductor (e.g., metal-insulator-metal) structure where the first electrode 134 is the first conductor, the antifuse dielectric 136 is the insulator, and the bottom conductor, such as the source or the drain contact 112, 114 is the second conductor.

The antifuse 102 and may either be in an "open circuit state" or a "closed circuit state." While the antifuse 102 is in an open state, the antifuse dielectric 136 acts as an open circuit insulator and prevents current flow between the drain interconnect 132 and the drain contact 114, and thus prevents current from flowing through the transistor's 101 source/drain terminals 106, 108. While the antifuse 102 is in a closed circuit state, the antifuse dielectric 136 acts substantially like a conductor allowing current to flow through the drain interconnect 132 and the drain contact 114, thereby allowing current to flow through the transistor's 101 source/drain terminals 106, 108.

In order to change the antifuse's 102 state from an open circuit state to a closed circuit state, a sufficiently high voltage is applied across the antifuse dielectric 136 (e.g., between the top electrode 134 and the drain contact 114) causing the antifuse dielectric 136 to rupture and create a conductive path. Depending on the type of dielectric material 136 selected, the conductive path created may be substantially permanent or temporary. For example, if the memory cell 100 is desired to be an OTP memory cell, then the dielectric 136 selected may be of a type that when ruptured the conductive path created is permanent. Examples of such dielectrics that can be used for OTP purposes include, but are not limited to, silicon nitride (SiN), silicon dioxide ($SiO_2$), hafnium oxide (HfO), etc. Thus, the OTP memory cell may be "programmed" by applying a sufficiently high voltage across the antifuse 102 to create the permanent conductive path.

By contrast, if the memory cell 100 is desired to be an MTP memory cell, then the particular dielectric used for the antifuse dielectric 136 may be of a type that can be reset to a non-conductive, insulating state after having been ruptured to create a conductive path. Examples of such dielectrics include, but are not limited to, titanium oxide (TiO), hafnium oxide (HfO), etc. Thus, the MTP memory cell may be reset or "reprogrammed" by applying different voltage across the antifuse 102.

The type and thickness t of the antifuse dielectric 136 chosen directly affects the voltage (hereinafter referred to as $V_{BD}$) necessary to break down the dielectric 136, and thus change the antifuse 102 from an open circuit state to a closed circuit state. For example, as the thickness t is reduced, less voltage across the dielectric 136 is needed to change its state from open to closed, i.e., $V_{BD}$ is reduced. As the thickness t is increased, more voltage across the antifuse dielectric 136 is needed to change its state from open to closed, i.e., $V_{BD}$ is increased. Notably, the thickness and type of the antifuse dielectric 136 may be selected such that the $V_{BD}$ is substantially equal to the input/output (I/O) voltage $V_{I/O}$ that supplies the integrated circuit in which the memory cell 100 resides. Thus, the antifuse 102 may be programmed using the IC's I/O voltage rather than requiring a dedicated charge pump that requires substantial resources, such as chip area and power.

The dielectric 136 used in the antifuse 102 may be different than the insulating material used for the gate dielectric 116 that separates the metal gate 110 from the substrate body 104. The gate dielectric 116 may have a $V_{BD}$ that is significantly higher than the $V_{BD}$ of the antifuse dielectric 136. Thus, during fabrication of the IC that contains the memory cell, one type of dielectric material having a relatively large $V_{BD}$ (e.g., greater than 1.5 times the IC's I/O voltage $V_{I/O}$) may be used to create the gate dielectric 116 and another type of dielectric material having a lower $V_{BD}$) (e.g., slightly less than the IC's I/O voltage but greater than $V_{DD}$) may be used to create the dielectric 136 for the antifuse 102. According to one example, the $V_{BD}$ of the antifuse dielectric 136 and the IC's I/O voltage $V_{I/O}$ is about 1.8 volts, and the nominal supply voltage $V_{DD}$ for the IC is about 1.2 volts. In such a case, the $V_{BD}$ of the gate dielectric 116 may be, for example, greater than 2 volts.

Of course the value ranges for $V_{BD}$ of the antifuse 102, $V_{BD}$ of the gate dielectric 116, $V_{I/O}$, and $V_{DD}$ may vary considerably depending on the application and scaling of the IC. For example, the IC's I/O voltage $V_{I/O}$ may range from 0.4 volts to 10.0 volts, and the nominal supply voltage $V_{DD}$ may have a correspondingly lower range, for example, 0.25 volts to 8.0 volts. Accordingly, $V_{BD}$ of the antifuse 102 may be less than $V_{I/O}$ but greater than $V_{DD}$ (e.g., it may range from 0.26 volts to 9.99 volts), and $V_{BD}$ of the gate dielectric 116 may then be greater than $V_{I/O}$ (e.g., greater than 0.40 volts).

Figure 2:
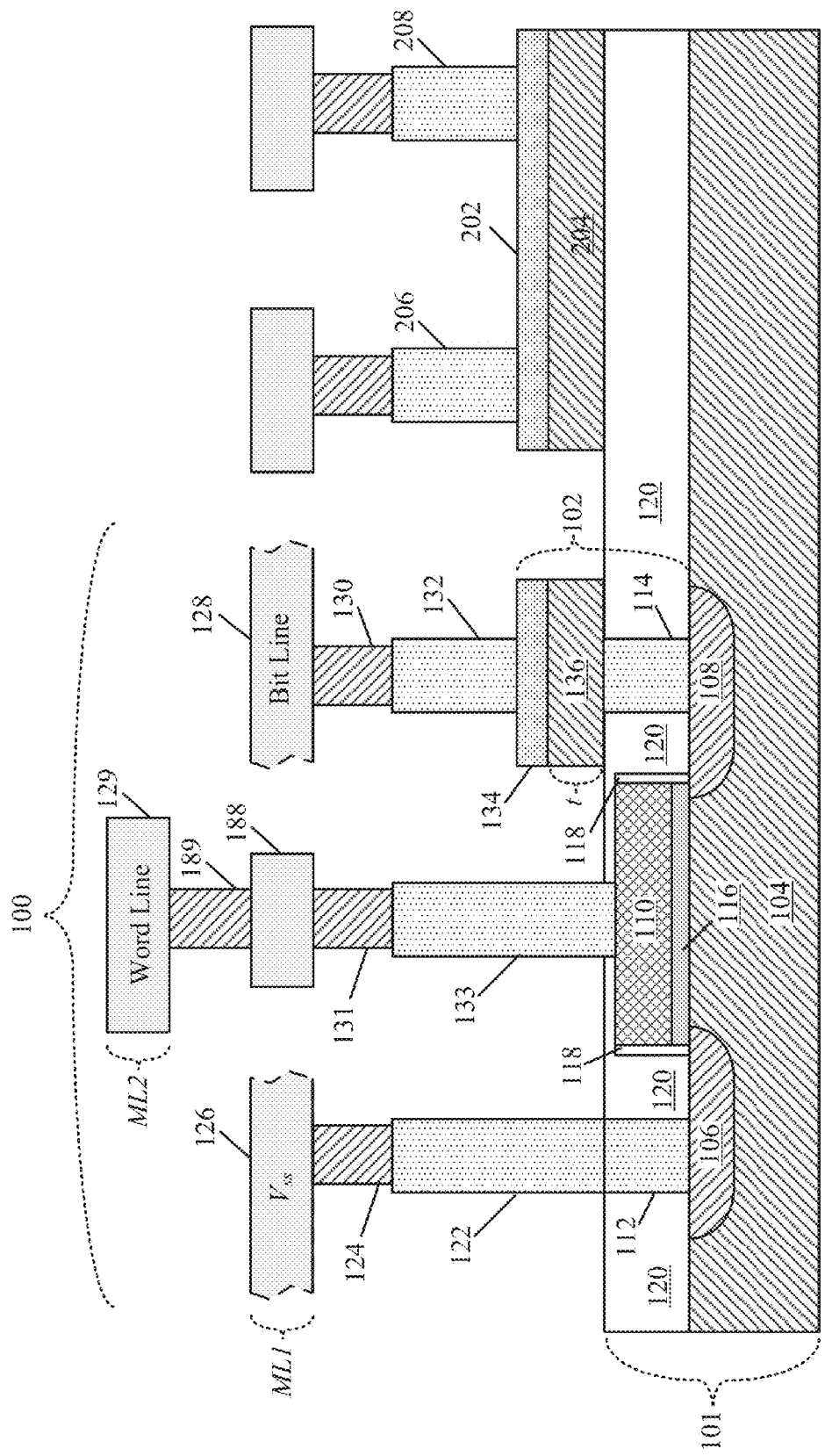
FIG. 2 illustrates a cross-sectional, schematic view of an integrated circuit resistor that is located adjacent to a programmable memory cell.

FIG. 2 illustrates a cross-sectional, schematic view of an integrated circuit resistor 202, that is located adjacent to the programmable memory cell 100 described above according to one aspect. One end of the resistor 202 may be electrically coupled to an interconnect 206, while the other end of the resistor 202 may be electrically coupled to another interconnect 208. The resistor 202 may be deposited on top of a dielectric support 204.

In the illustrated example, the resistor 202 is composed of the same material used for the top electrode 134 of the antifuse 102. In this fashion, a separate deposition step using a different material just for the top electrode 134 is unnecessary. Similarly, the dielectric support 204 is composed of the same material used for the antifuse dielectric 136 of the antifuse 102. Thus, during fabrication of the IC, the masks responsible for creating the antifuse dielectric 136 and top electrode 134 of the antifuse 102 may be simultaneously used to create the dielectric support 204 and the resistor 202. In this fashion, manufacturing costs may be minimized by reducing the number of masks necessary to create both the antifuse 102 and resistor 202. According to one aspect, the resistor 202 and the top electrode 134 may be made of titanium nitride (TiN). According to other aspects, the top electrode 134 and the resistor 202 may be made of any other conductive material.

Figure 3:
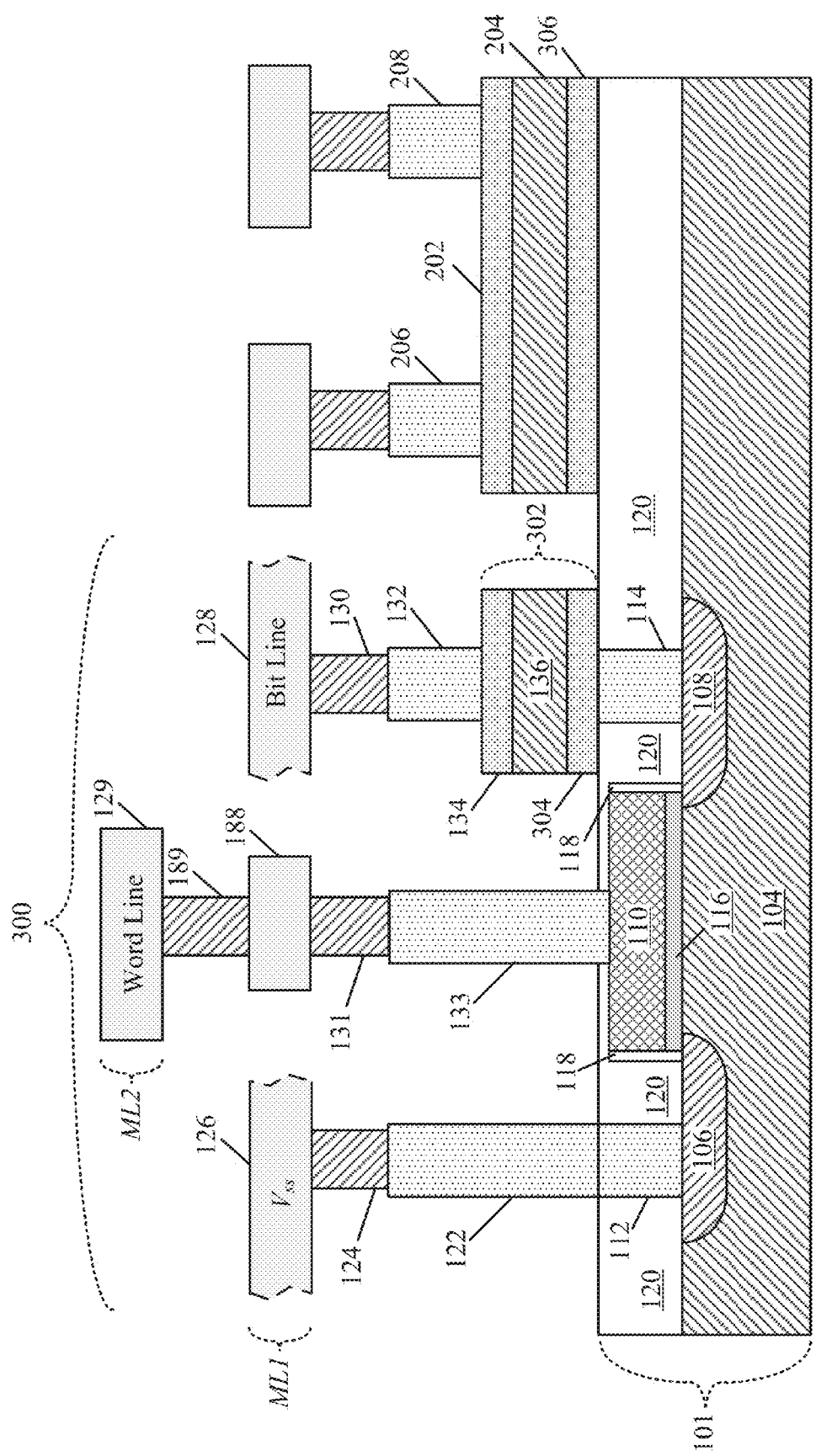
FIG. 3 illustrates a second exemplary cross-sectional, schematic view of an integrated circuit programmable memory cell featuring an antifuse.

FIG. 3 illustrates a cross-sectional, schematic view of an integrated circuit programmable memory cell 300 featuring an antifuse 302 according to one aspect. The memory cell 300 is identical to the memory cell 100 shown in FIGS. 1 and 2, except that the memory cell 300 of FIG. 3 features an antifuse 302 having a bottom electrode 304 (e.g., "second electrode") as well. In this fashion, the bottom surface of antifuse dielectric 136 is electrically coupled to a conductive bottom electrode 304, and the top surface of the antifuse dielectric 136 is electrically coupled to the conductive top electrode 134. Interposing the antifuse dielectric 136 in between two electrodes 134, 304 may allow for improved electrical contact at the bottom and top surfaces of the antifuse dielectric 136, thereby allowing for more reliable and predictable breakdown of the antifuse dielectric 136 if the proper $V_{BD}$ is applied across the antifuse dielectric 136. Thus, the antifuse 302 has a conductor-insulator-conductor (e.g., metal-insulator-metal) structure where the first electrode 134 is the first conductor, the antifuse dielectric 136 is the insulator, and the second electrode 304 is the second conductor.

In the illustrated example, the antifuse 302 lies between the drain contact 114 and a drain interconnect 132. However, in other examples the antifuse 302 may lie between the drain interconnect 132 and the via 130, or between the via 130 and the second metal trace 128. According to one aspect, regardless of whether the antifuse 302 is positioned between the drain contact 114 and the drain interconnect 132, the drain interconnect 132 and the via 130, or the via 130 and the second metal trace 128, the antifuse 302 may be positioned such that it is generally above the drain 108 of the transistor 101. That is, at least a portion of the antifuse 302 may be positioned in a region or space that is above the drain 108, an example of which is shown in FIG. 3. According to one aspect, the antifuse 302 is positioned, at least in part, in a same vertical plane as the source/drain region as shown in FIG. 3.

Also illustrated in FIG. 3 is the resistor 202 that is located adjacent to the memory cell 300. In this example, the dielectric support 204 is deposited on top of a conductive layer 306. The conductive layer 306 and the bottom electrode 304 may be both made of the same material. During fabrication of the IC, the masks responsible for creating the bottom electrode 304, the dielectric 136, and the top electrode 134 of the antifuse 302 may be simultaneously used to create the conductive layer 306, the dielectric support 204, and the resistor 202. In this fashion, manufacturing costs may be minimized by reducing the number of masks necessary to create both the antifuse 302 and resistor 202. According to one aspect, the bottom electrode 304 and the conductive layer 306 may be both made of titanium nitride (TiN). According to other aspects, other conductive materials may be used.

In the aspects of the disclosure described above with respect to FIGS. 1-3, the antifuses 102, 302 are not limited to being positioned above/over the drain contact 114. Instead, the antifuses 102, 302 may similarly be positioned above/over the source contact 112 with no significant difference in operation.

Figure 4:
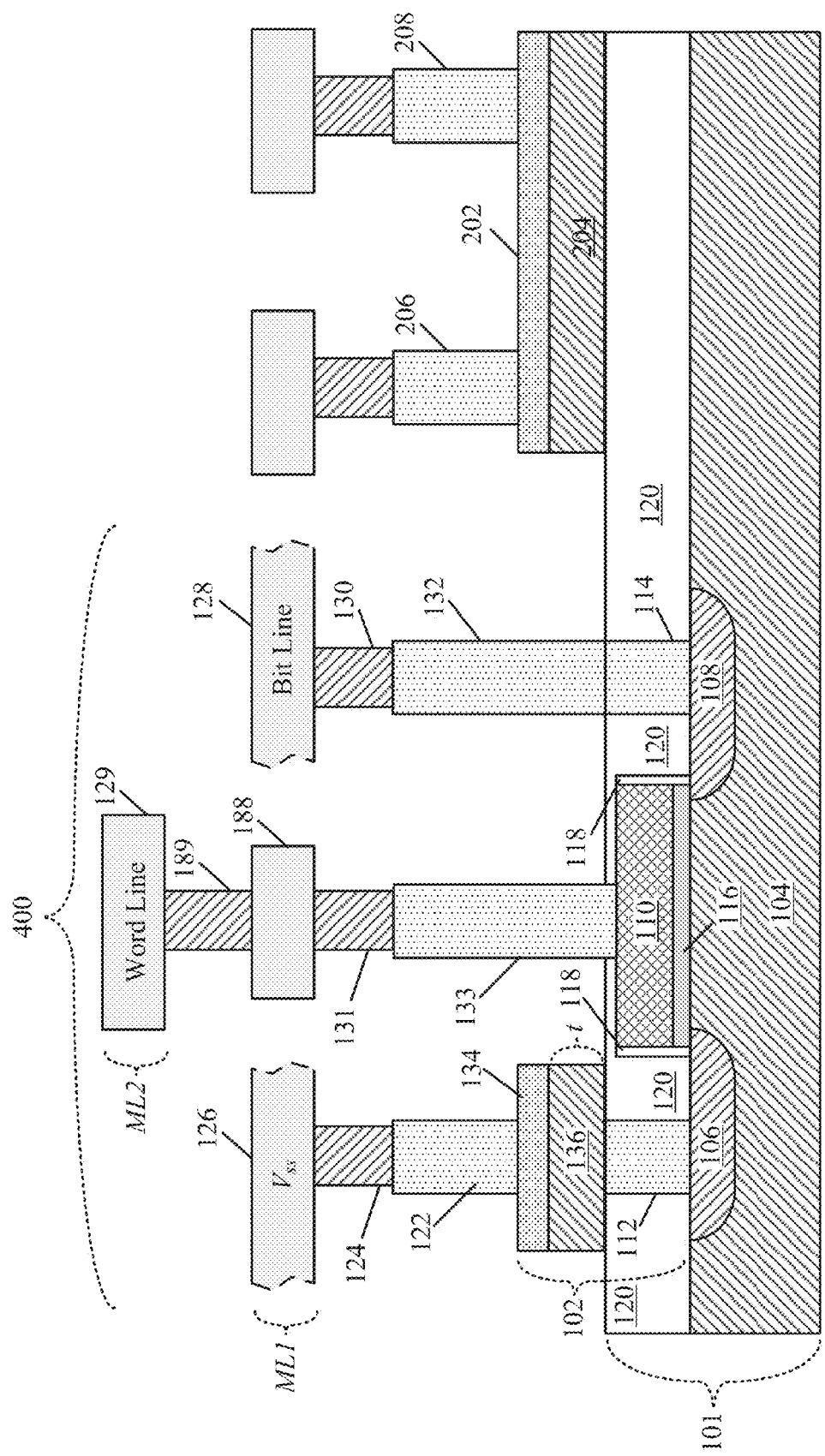
FIGS. 4 and 5 illustrate a third exemplary cross-sectional, schematic views of integrated circuit programmable memory cells featuring antifuses positioned over a source contact.
Figure 5:
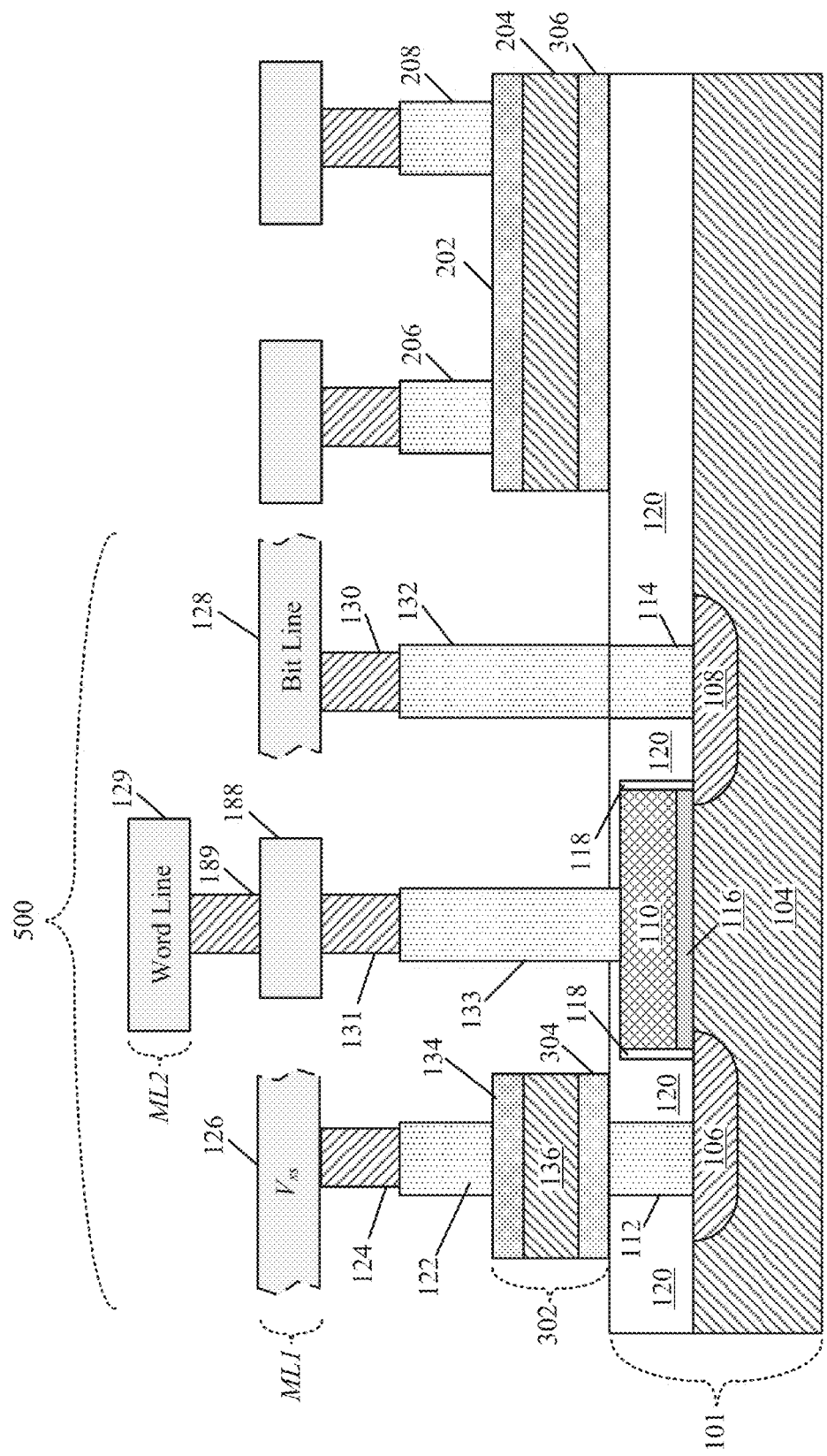

FIGS. 4 and 5 illustrate cross-sectional, schematic views of integrated circuit programmable memory cells 400, 500 featuring the antifuses 102, 302, respectively, positioned over the source contact 112 according to one aspect. In the illustrated examples, the antifuses 102, 302 lie between the source contact 112 and the source interconnect 122. However, in other examples the antifuses 102, 302 may lie between the source interconnect 122, and the via 124, or between the via 124 and the first metal trace 126. According to one aspect, regardless of whether the antifuses 102, 302 are positioned between the source contact 112 and the source interconnect 122, the source interconnect 122 and the via 124, or the via 124 and the first metal trace 126, the antifuses 102, 302, may be positioned such that they are generally above the source 106 of the transistor 101. That is, at least a portion of the antifuses 102, 302 may be positioned in a region or space that is above the source 106, examples of which are shown in FIGS. 4 and 5. According to one aspect, the antifuses 102, 302 may be positioned, at least in part, in a same vertical plane as the source region 106 as shown in FIGS. 4 and 5.

Figure 6:
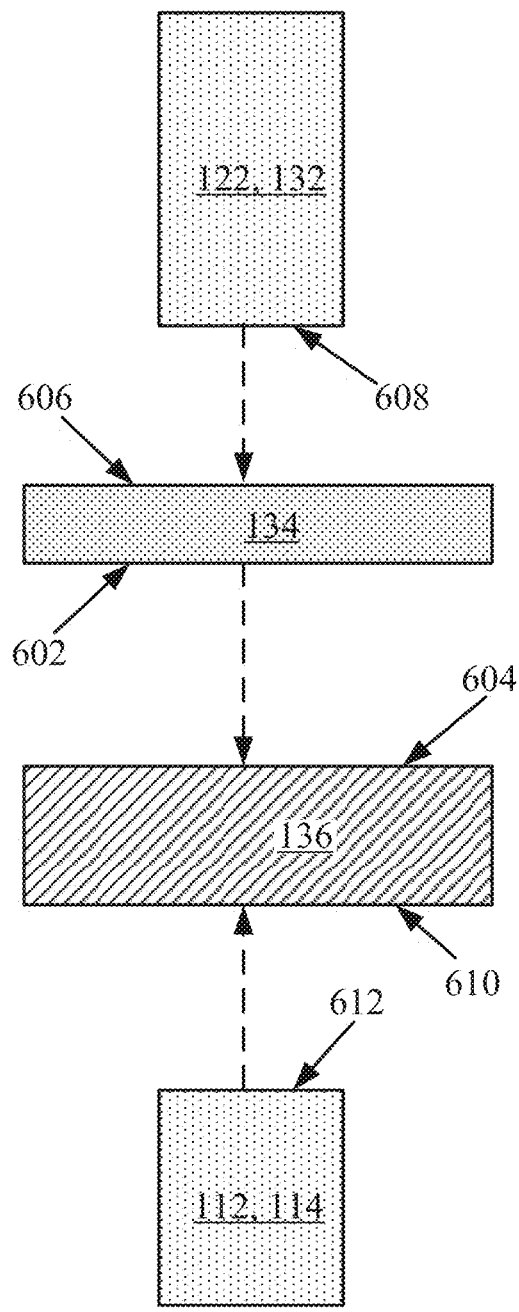
FIG. 6 illustrates a source/drain interconnect, a top electrode, an antifuse dielectric, and a source/drain contact separated from one another to better illustrate various surfaces of these components.

FIG. 6 illustrates the source/drain interconnect 122, 132 (e.g., either the source interconnect 122, from FIG. 4 or the drain interconnect 132 from FIGS. 1 and 2), the top electrode 134, the antifuse dielectric 136, and the source/drain contact 112, 114 (e.g., either the source contact 112 from FIG. 4 or the drain contact 114 from FIGS. 1 and 2) separated from one another to better illustrate various surfaces of these components. The top electrode 134 (e.g., "first electrode", or "first conductor") has a bottom surface 602 (e.g., "first surface") that may couple to a top surface 604 (e.g., "first surface") of the antifuse dielectric 136. The top electrode 134 may also feature a top surface 606 (e.g., "second surface") that is coupled to a bottom surface 608 (e.g., "first surface") of a conducting element, such as the source/drain interconnect 122, 132. The antifuse dielectric 136 may also have a bottom surface 610 (e.g., "second surface") that is coupled to a top surface 612 (e.g., "first surface") of a second conductor, such as the source/drain contact 112, 114. According to one aspect, the top electrode 134 serves as a first means for conducting, the antifuse dielectric refers to a first means for insulating, and the source/drain contact 112, 114 serves as a second means for conducting.

Figure 7:
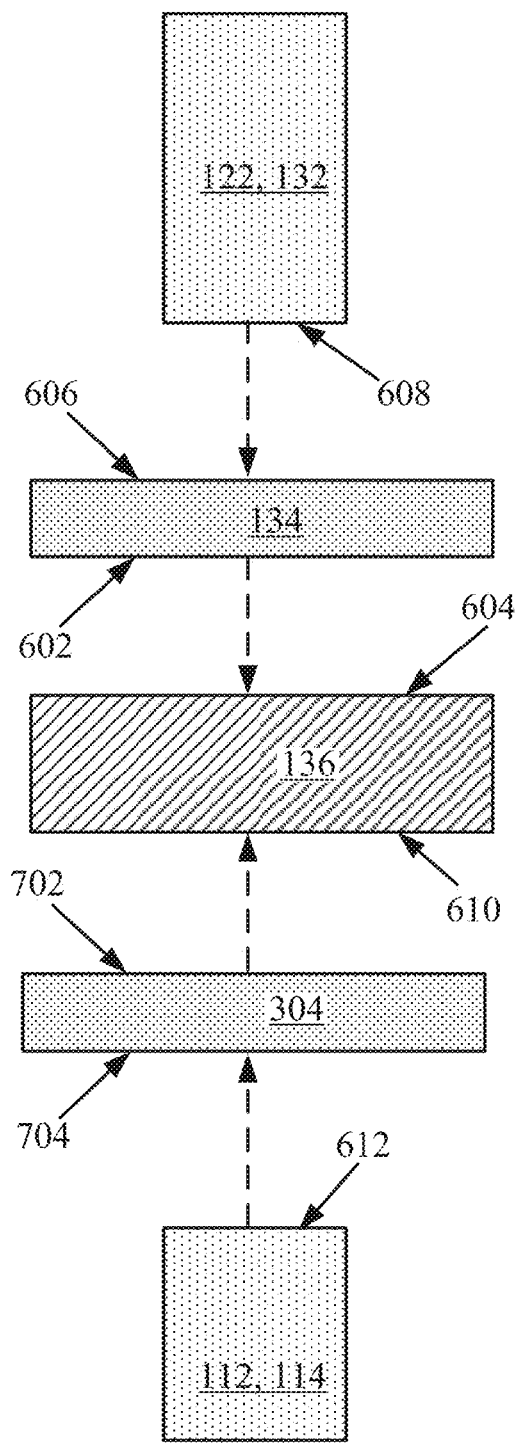
FIG. 7 illustrates a source/drain interconnect, a top electrode, an antifuse dielectric, a bottom electrode, and a source/drain contact separated from one another to better illustrate various surfaces of these components.

FIG. 7 illustrates the source/drain interconnect 122, 132 (e.g., either the source interconnect 122 from FIG. 5 or the drain interconnect 132, from FIG. 3), the top electrode 134, the antifuse dielectric 136, the bottom electrode 304, and the source/drain contact 112, 114 (e.g., either the source contact 112 from FIG. 5 or the drain contact 114 from FIG. 3) separated from one another to better illustrate various surfaces of these components. In this example, the antifuse dielectric's 136 bottom surface 610 is coupled to a top surface 702 (e.g., "first surface") of the bottom electrode 304 (e.g., "second conductor"). A bottom surface 704 (e.g., "second surface") of the bottom electrode 304 may in turn be coupled to the top surface 612 of a conductor, such as the source/drain contact 112, 114. According to one aspect, the second electrode 304 serves as a second means for conducting.

Figure 8:
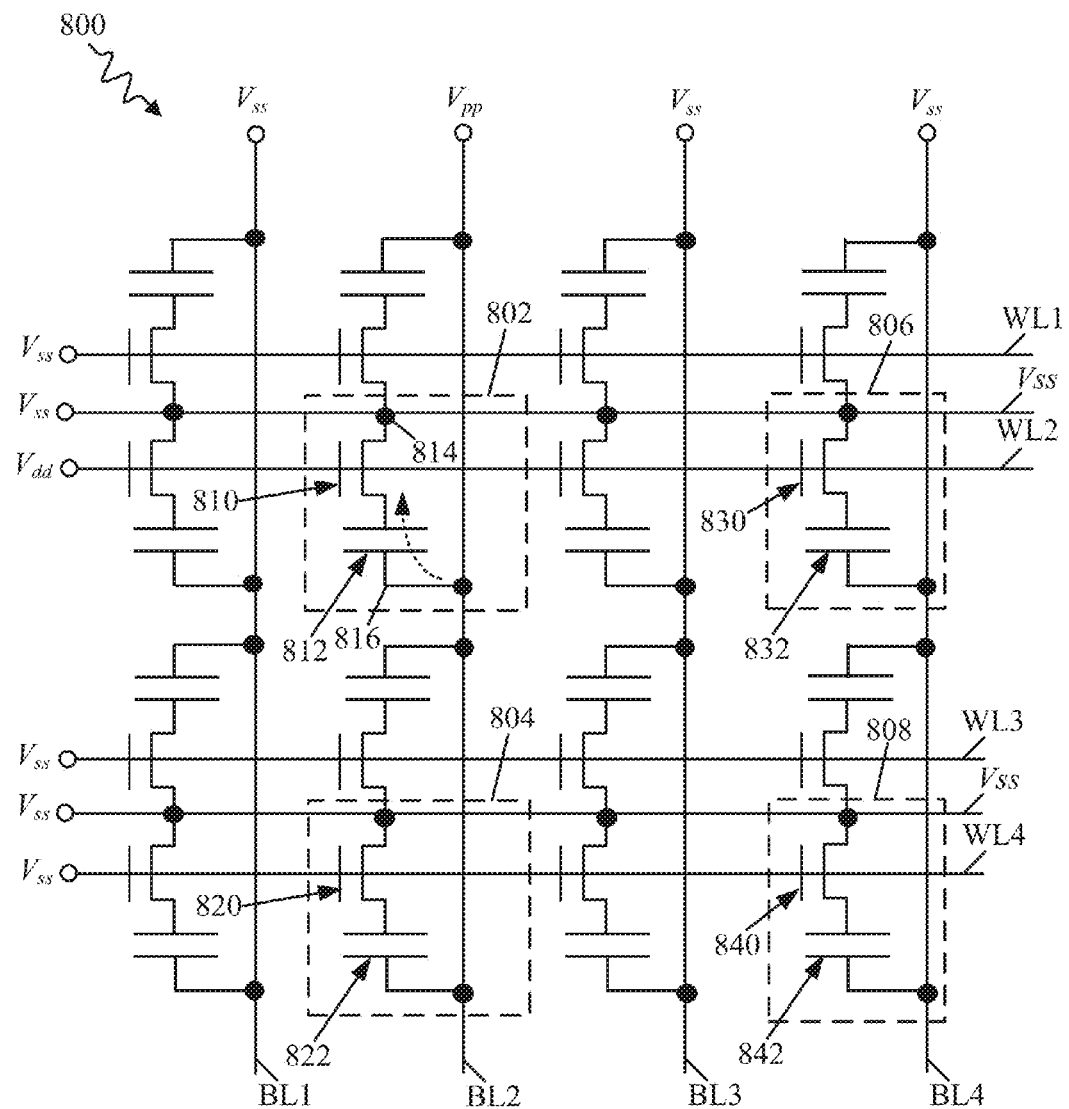
FIGS. 8 and 9 illustrate schematic diagrams of a programmable memory cell array.
Figure 9:
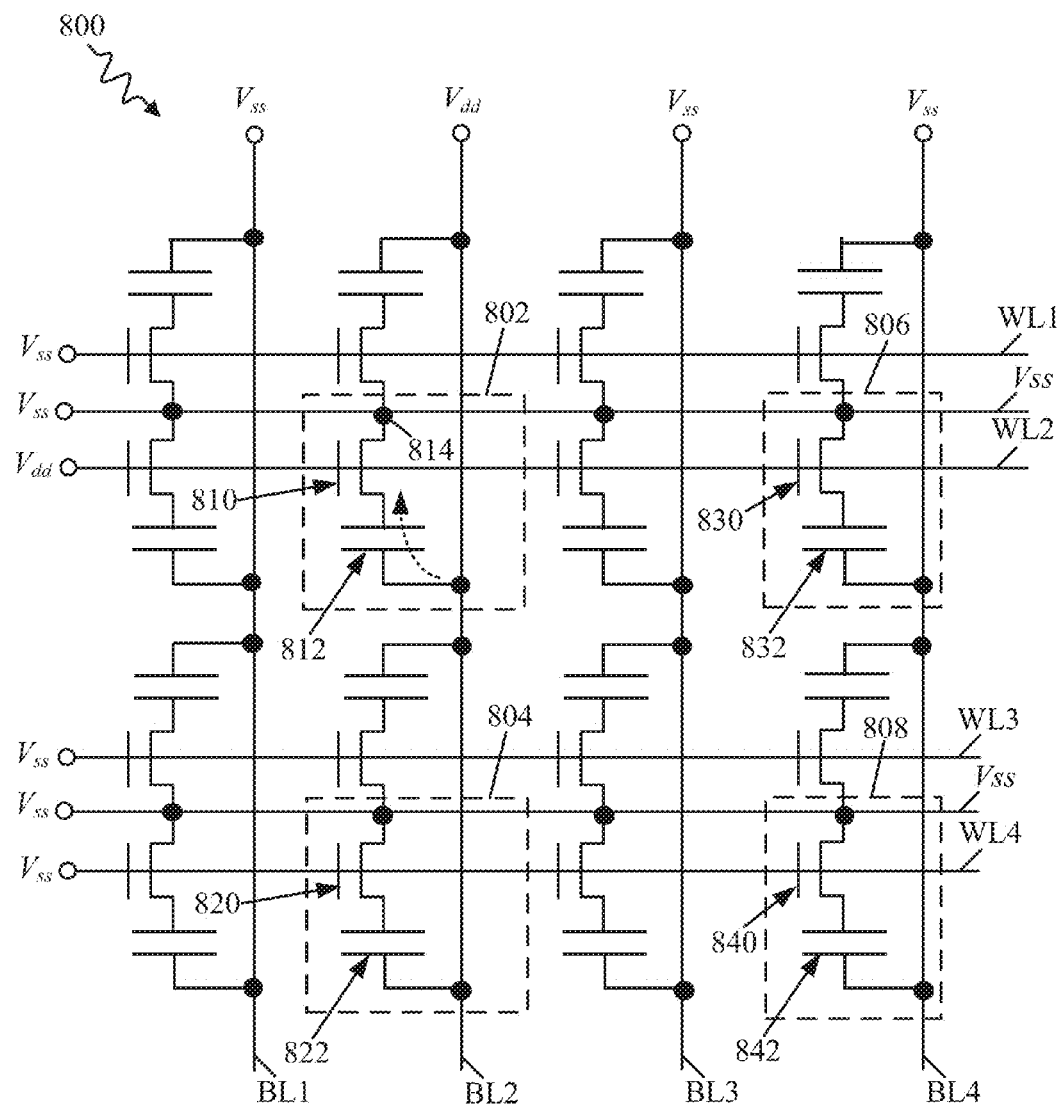

FIGS. 8 and 9 illustrate schematic diagrams of a programmable memory cell array 800 according to one aspect of the present disclosure. The array 800 is comprised of a plurality of programmable memory cells 802, 804, 806, 808 having antifuses as described herein. The "read" and "write" operations of the memory cells 802, 804, 806, 808 are controlled by the voltages applied to their respective bit lines (BL) and word lines (WL). The memory cells 802, 804, 806, 808 may each be any one of the memory cells 100, 300, 400, 500 described with respect to FIGS. 1-5. The memory cells 802, 804, 806, 808 each comprise an access transistor 810, 820, 830, 840 and an antifuse 812, 822, 832, 842. The access transistors 810, 820, 830, 840 may be, for example, an n-channel field effect transistor. The access transistors 810, 820, 830, 840 may be identical to the transistor 101 shown in FIGS. 1-5 and thus include the source 106, the drain 108, the gate 110, and the body 104. The antifuses 812, 822, 832, 842 may be any one of the antifuses 102, 302 shown in FIGS. 1-5. According to one aspect, the memory cells 802, 804, 806, 808 may be OTP memory cells where the antifuses 812, 822, 832, 842 may only change their state from an open circuit state to a closed circuit state once.

Referring to FIG. 8, a memory cell 802 is undergoing a write operation (i.e., it is being programmed). In order to write a value (e.g., change the logical state from "0" to "1" or "1" to "0") of the memory cell 802, various voltages at the terminals of the access transistor 810 and the antifuse 812 must be appropriately set. The voltage at the gate of the transistor 810 is controlled by a word line WL2, and the voltage at one side 816 (e.g., the top electrode 134 in FIGS. 1-5) of the antifuse 812 is controlled by a bit line BL2. For example, as shown in FIG. 8, a value may be written by electrically coupling the access transistor's source 814 to the ground reference voltage $V_{ss}$, setting WL2 and the transistor's 810 gate to the nominal supply voltage $V_{dd}$, and setting BL2 and an antifuse's terminal 816 (e.g., top electrode 134 in FIGS. 1-5) to the programming voltage $V_{pp}$. Note that the nominal supply voltage $V_{dd}$ is greater than the threshold voltage $V_{TH}$ of the transistor 810. According to one aspect of the disclosure $V_{pp} > V_{dd}$, and $V_{pp}$ may be equal to the I/O voltage of the IC in which the memory cell array 800 resides. Moreover, $V_{pp}$ is greater than the breakdown voltage $V_{BD}$ of the antifuse 812. As just one example, $V_{pp}$ may be approximately 1.8 volts and $V_{dd}$ may be approximately 1.2 volts.

Applying the voltage $V_{dd}$ to the access transistor's 810 gate causes the access transistor 810 to activate and become conductive (i.e., an inversion layer is formed below the gate making substantial current flow between the source and the drain possible), assuming the body terminal of the transistor is grounded. Increasing the bit line BL2 voltage to $V_{pp}$ causes the antifuse 812 to transition from an open circuit state to a closed circuit state (i.e., the antifuse dielectric 136 material within the antifuse 812 ruptures) because the voltage across the antifuse 812 exceeds the breakdown voltage $V_{BD}$ of the antifuse's 812 dielectric. The resulting conductive path across the antifuse 812 makes current flow through the bit line BL2 and the access transistor 810 (as indicated by the curved, dashed arrow) possible if a positive voltage is subsequently applied to the bit line BL2 and the gate voltage of the access transistor 810 exceeds $V_{TH}$.

While the memory cell 802 is undergoing a write operation (i.e. programming operation), the memory cell 804 comprised of the access transistor 820 and the antifuse 822 is essentially inactive and no significant current flows through the access transistor 820. Since the gate of the transistor 820 is coupled to $V_{ss}$ the transistor 820 is inactive and no significant current (i.e., besides negligible leakage current) may flow through the transistor 820. Similarly, the memory cell 806 comprised of the transistor 830 and the antifuse 832 is also inactive and no significant current flows through the transistor 830. Although the voltage of the gate of the transistor 830 is $V_{dd}$, no current flows through the access transistor 830 because both the source and the drain of the access transistor 830 are grounded. Similarly, the memory cell 808 comprised of the transistor 840 and the antifuse 842 is also inactive because the gate, the drain, and the source of the transistor 840 are grounded, and hence now current flows through the transistor 840.

Referring to FIG. 9, the memory cell 802 is undergoing a "read" operation. In order to read a value (e.g., read the logical state "0" or "1") from the memory cell 802, various voltages at the terminals of the transistor 810 and the antifuse 812 must be appropriately set. For example, as shown in FIG. 9, this may include setting the transistor's source 814 to $V_{ss}$, and setting the transistor's 810 gate and the antifuse's terminal 816 to $V_{dd}$. Applying the voltage $V_{dd}$ to the gate of the transistor 810 causes the transistor 810 to activate and become conductive (i.e., an inversion layer is formed below the gate making current flow between the source and the drain possible). Increasing the bit line BL2 voltage to $V_{dd}$ may cause current to flow through the antifuse 812 and the transistor 810 depending on the state of the antifuse 812. For example, if the antifuse 812 is in an open circuit state (e.g., it has not been programmed), then no significant current will flow through the bit line BL2, which may represent a first logical state, such as "0." If the antifuse 812 is in a conductive, closed circuit state (e.g., it has been programmed/written), then a significant amount of current will flow (as indicated by the dashed, curved arrow) through the bit line BL2, which may represent a second logical state, such as "1."

While the memory cell 802 is undergoing a read operation, memory cells 804, 806, and 808 may be inactive because the gate voltages of their associated access transistors 820, 830, 840 may not exceed $V_{TH}$ and/or the voltage differential between their sources and drains is negligible.

In this fashion, setting the voltages of the bit lines to $V_{pp}$ may allow for programming of the memory cells 802, 804, 806, 808 while setting the voltages of the bit lines to $V_{dd}$ may allow for reading of the memory cells 802, 804, 806, 808. Thus, the memory cells 802, 804, 806, 808 may be programmed using an I/O voltage of the IC and read using a nominal supply voltage that is less than the I/O voltage, such the nominal supply voltage.

According to another aspect, the memory cells 802, 804, 806, 808 may be MTP memory cells where the antifuses 812, 822, 832, 842 may change their states from an open circuit state to a closed circuit state and back again to an open circuit state multiple times if the antifuse dielectric used within the antifuse 812, 822, 832, 842 is designed to form and break conductive paths multiple times based on the voltage applied across the antifuse dielectric. In such a case, the memory cells 802, 804, 806, 808 may be reprogrammed (i.e. re-written) by applying appropriate voltages to the terminals of the transistors 810, 820, 830, 840 and the antifuses 812, 822, 832, 842. For example, the memory cell 802 may be reprogrammed to an open circuit state by applying a voltage $V_{dd}$ to the transistor's 810 gate, $V_{pp}$ to the access transistor's source 814, and $V_{ss}$ to the BL2.

Figure 10:
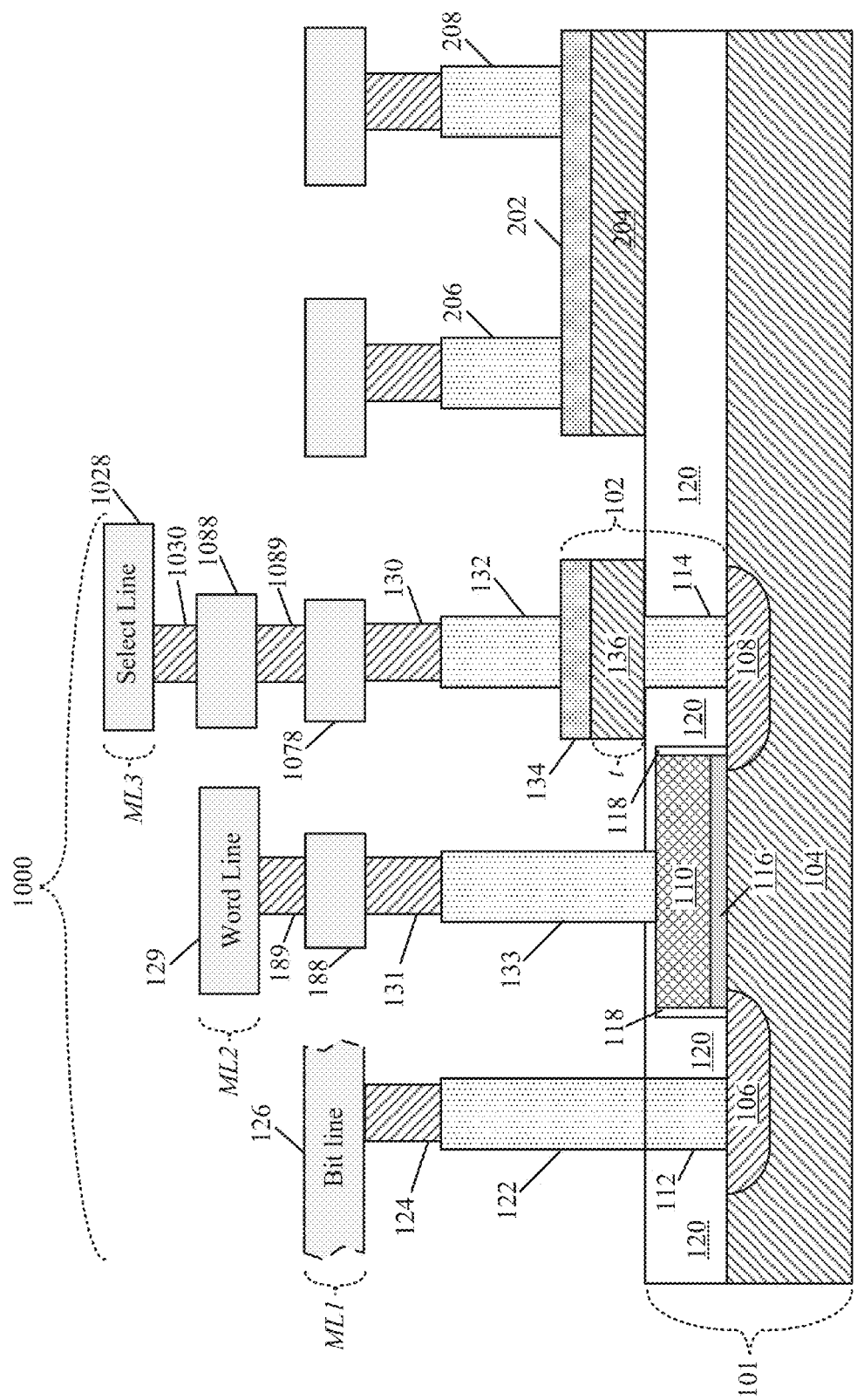
FIGS. 10, 11, 12, and 13 illustrate cross-sectional, schematic views of additional examples of IC programmable memory cells featuring the antifuses.
Figure 31:
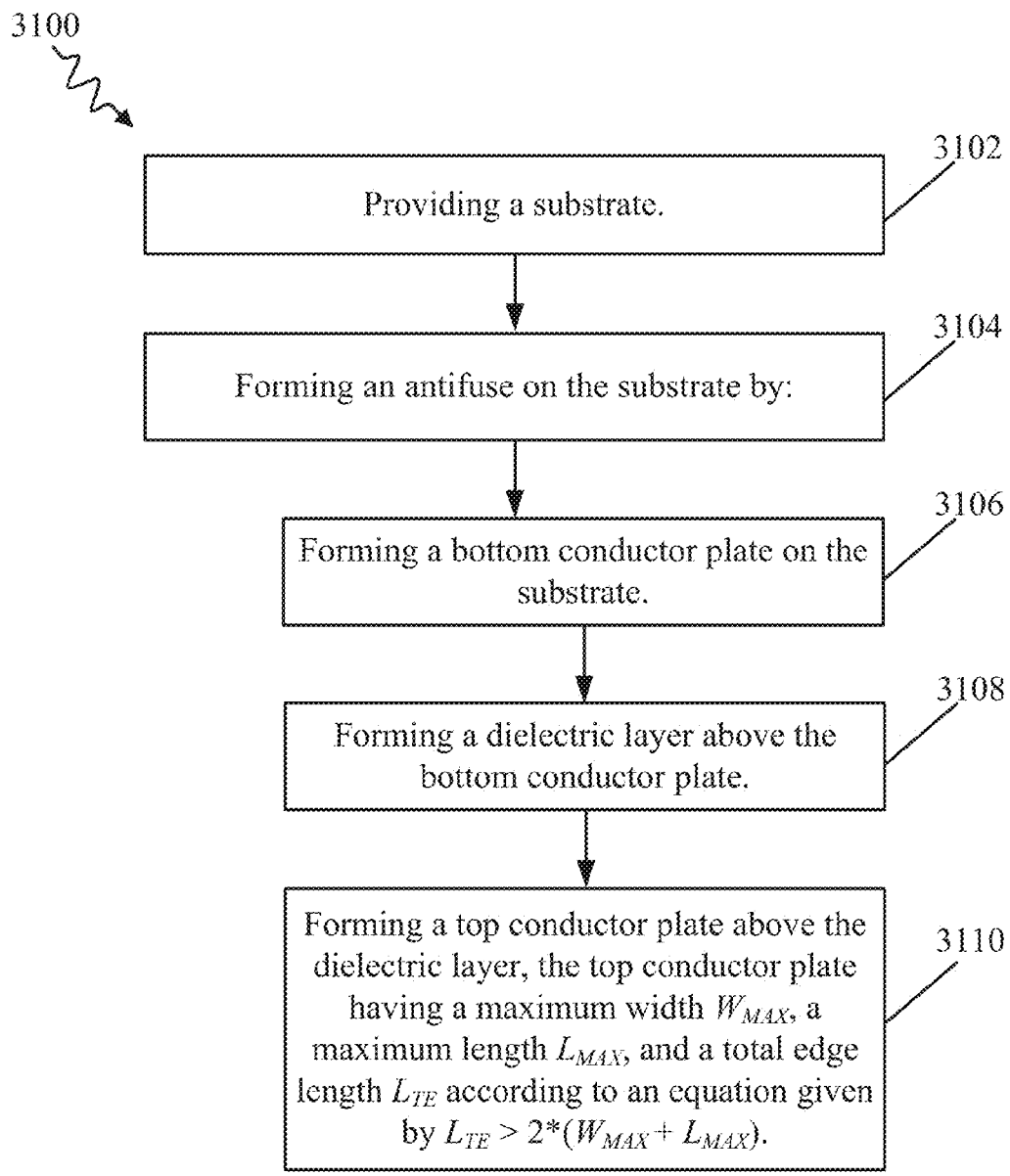
FIG. 31 illustrates a method of manufacturing an IC antifuse having a patterned top conductor plate.

FIGS. 10 and 31 illustrate cross-sectional, schematic views of IC programmable memory cells 1000, 1100 featuring the antifuses 102, 302, respectively, according to one aspect. The memory cell 1000 is identical to the memory cell 100 shown in FIGS. 1 and 2, except that the first metal trace 126 is electrically coupled to a bit line, and a second metal trace 1028 associated with a third metal layer ML3 is electrically coupled to a select line (XL). The second metal 1028 of the third metal layer ML3 may be electrically coupled to the via 130 through a series of traces 1088, 1078 and vias 1030, 1089. The memory cell 1100 is identical to the memory cell 300 shown in FIG. 3, except that the first metal trace 126 is electrically coupled to the bit line, and the second metal trace 1028 associated with the third metal layer ML3 is electrically coupled to the select line (XL). The third metal trace 1028 of the third metal layer ML3 may be electrically coupled to the via 130 through a series of traces 1088, 1078 and vias 1030, 1089.

Figure 11:
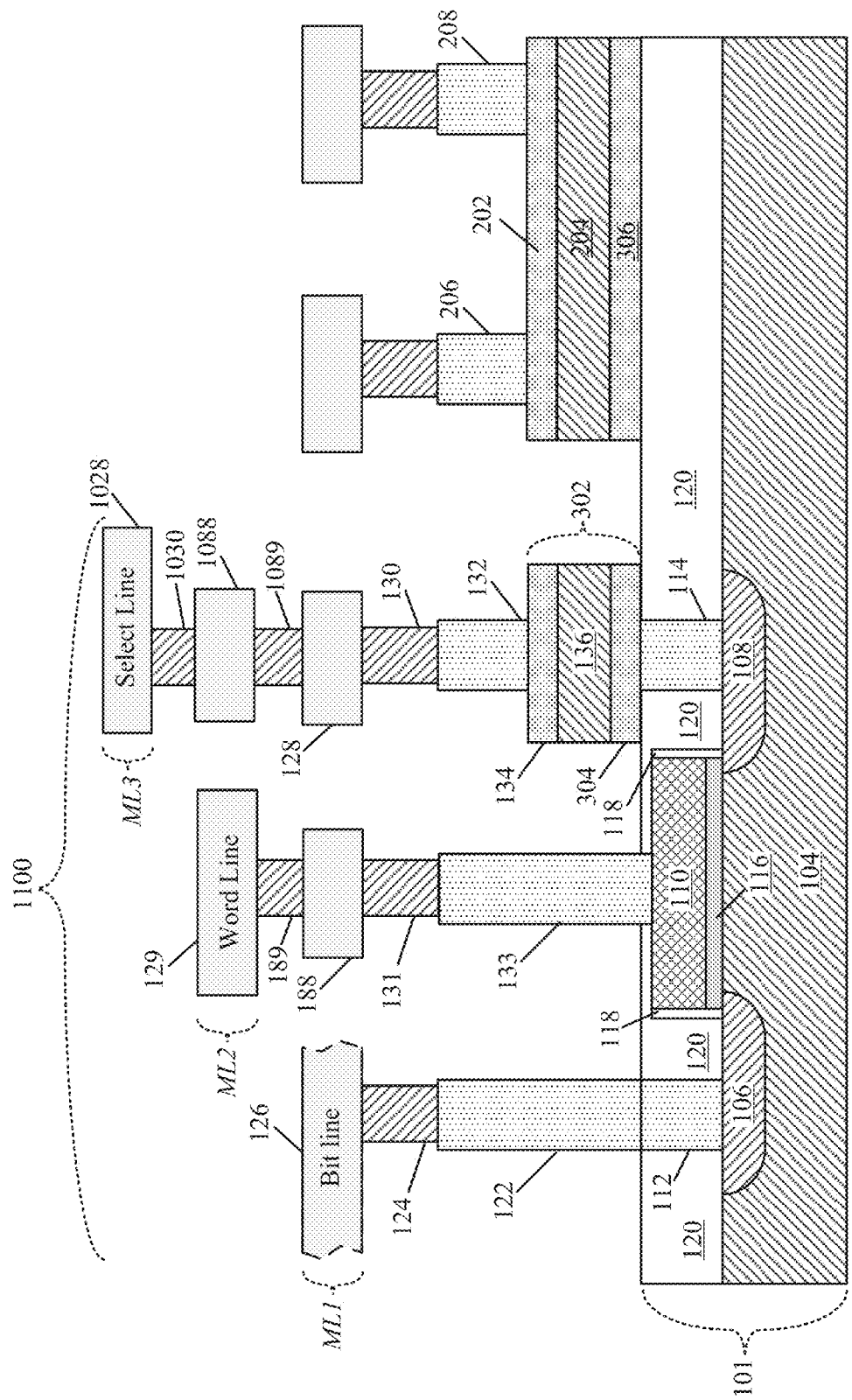
Figure 12:
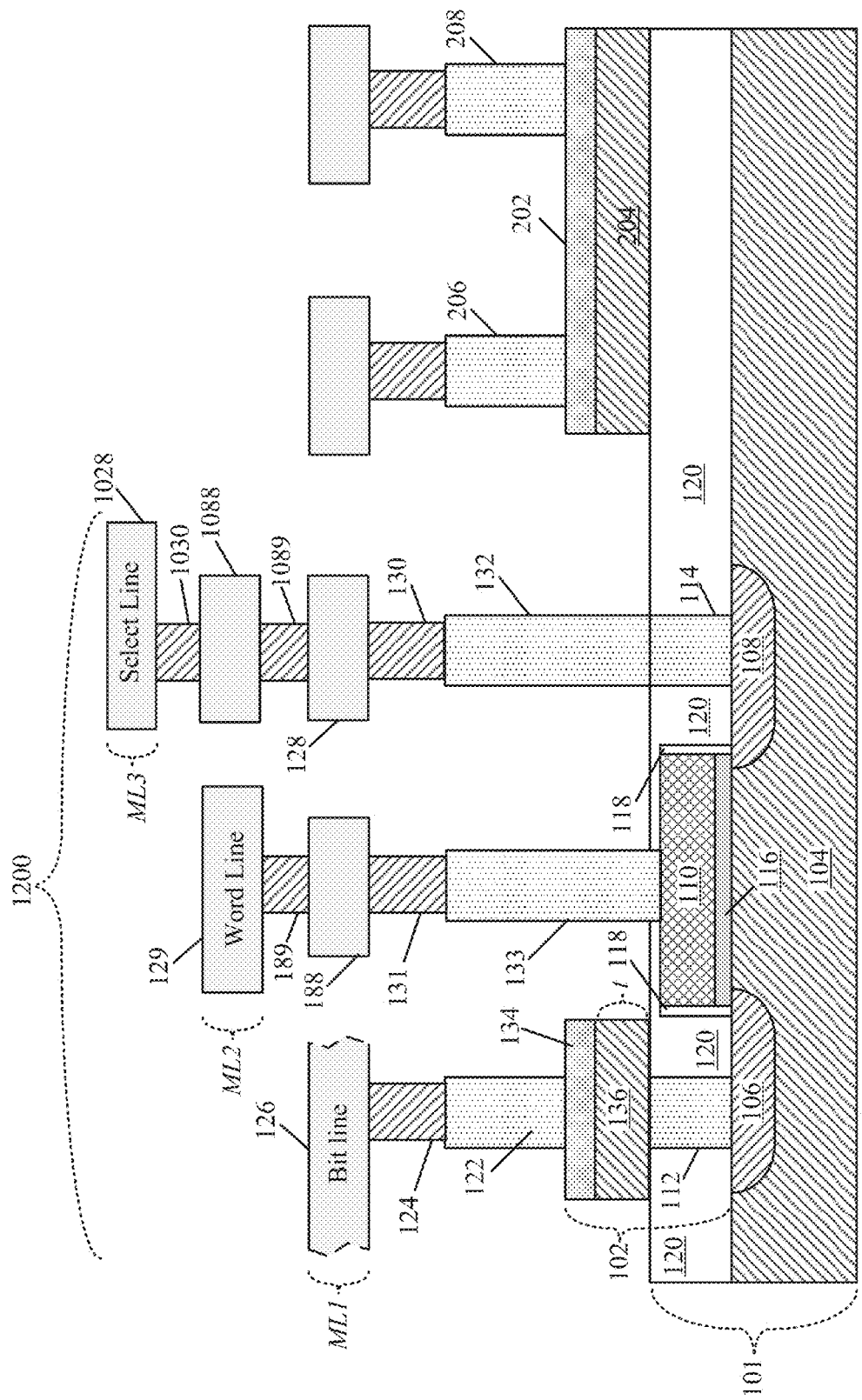
Figure 13:
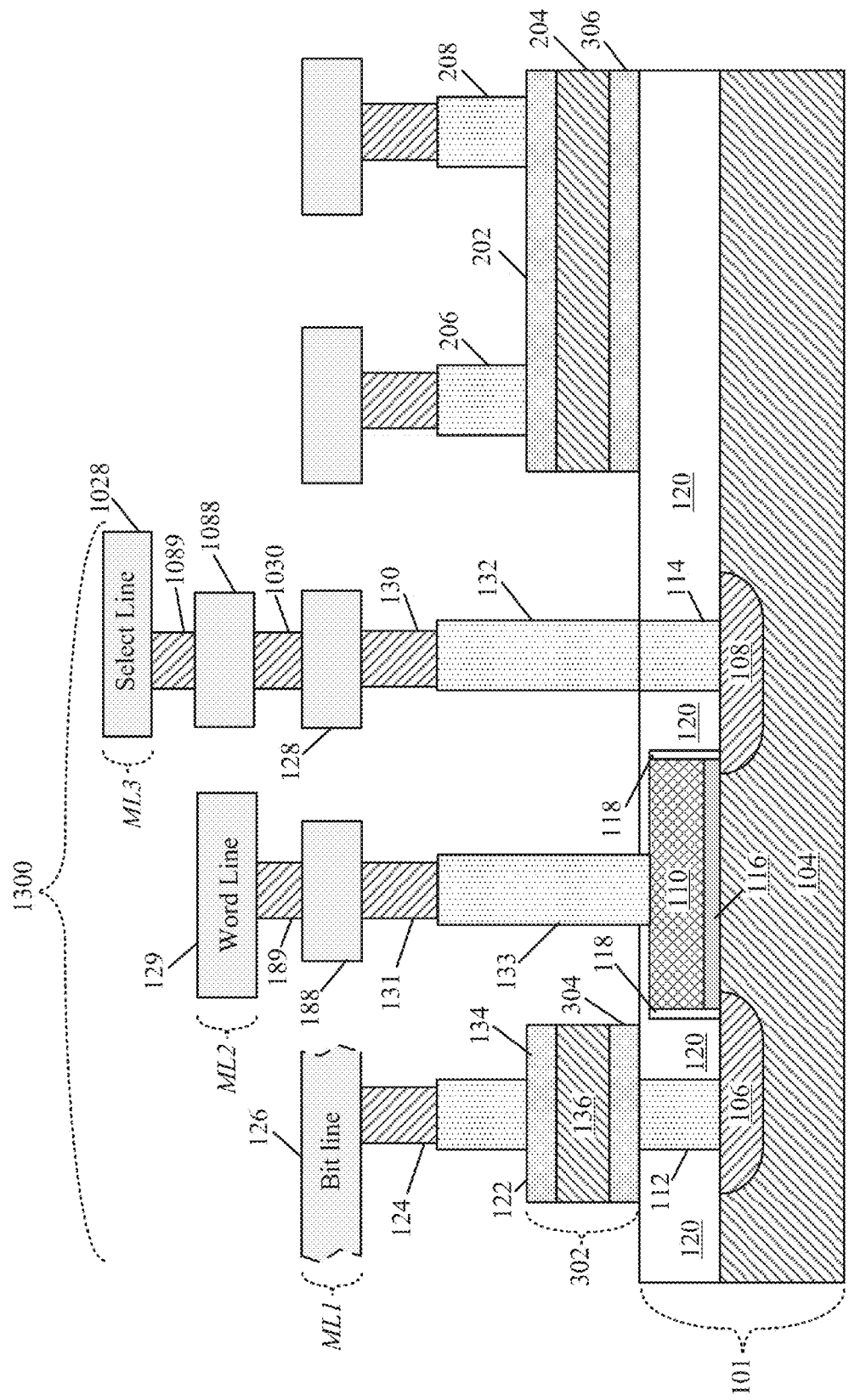

In the examples of memory cells 100, 300 shown in FIGS. 10 and 11, the antifuses 102, 302 are positioned above the first source/drain region 108. However, similar to the memory cells 400, 500 shown in FIGS. 4 and 5, the antifuses 102, 302 of the memory cells 1000, 1100 of FIGS. 10 and 11 may be positioned so that they are above the second source/drain region 106. FIGS. 12 and 13 illustrate cross-sectional, schematic views of IC programmable memory cells 1200, 1300 that feature antifuses 102, 302, respectively, that are positioned above the second source/drain region 106 according to one aspect. Although, as described herein, the elements 106, 112, 122, and 124 may be associated with the "source" of the transistor 101, and elements 108, 114, 132, and 130 may be associated with the "drain" of the transistor 101, these elements may be associated with either the actual source or the drain depending on the polarity of the voltage applied to the source/drain terminals 106, 108 of the transistor 101.

Figure 14:
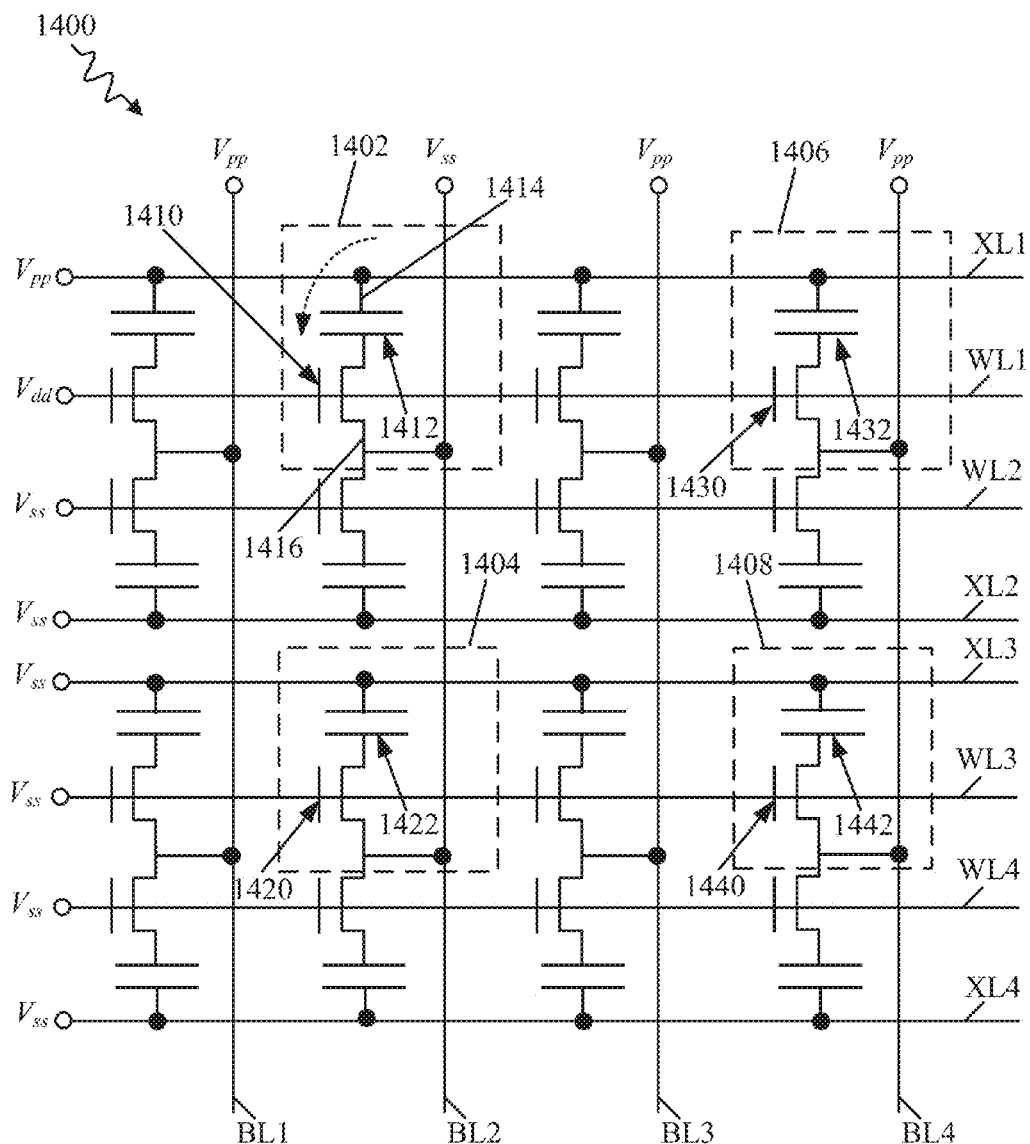
FIGS. 14 and 15 illustrate schematic diagrams of a programmable memory cell array.
Figure 15:
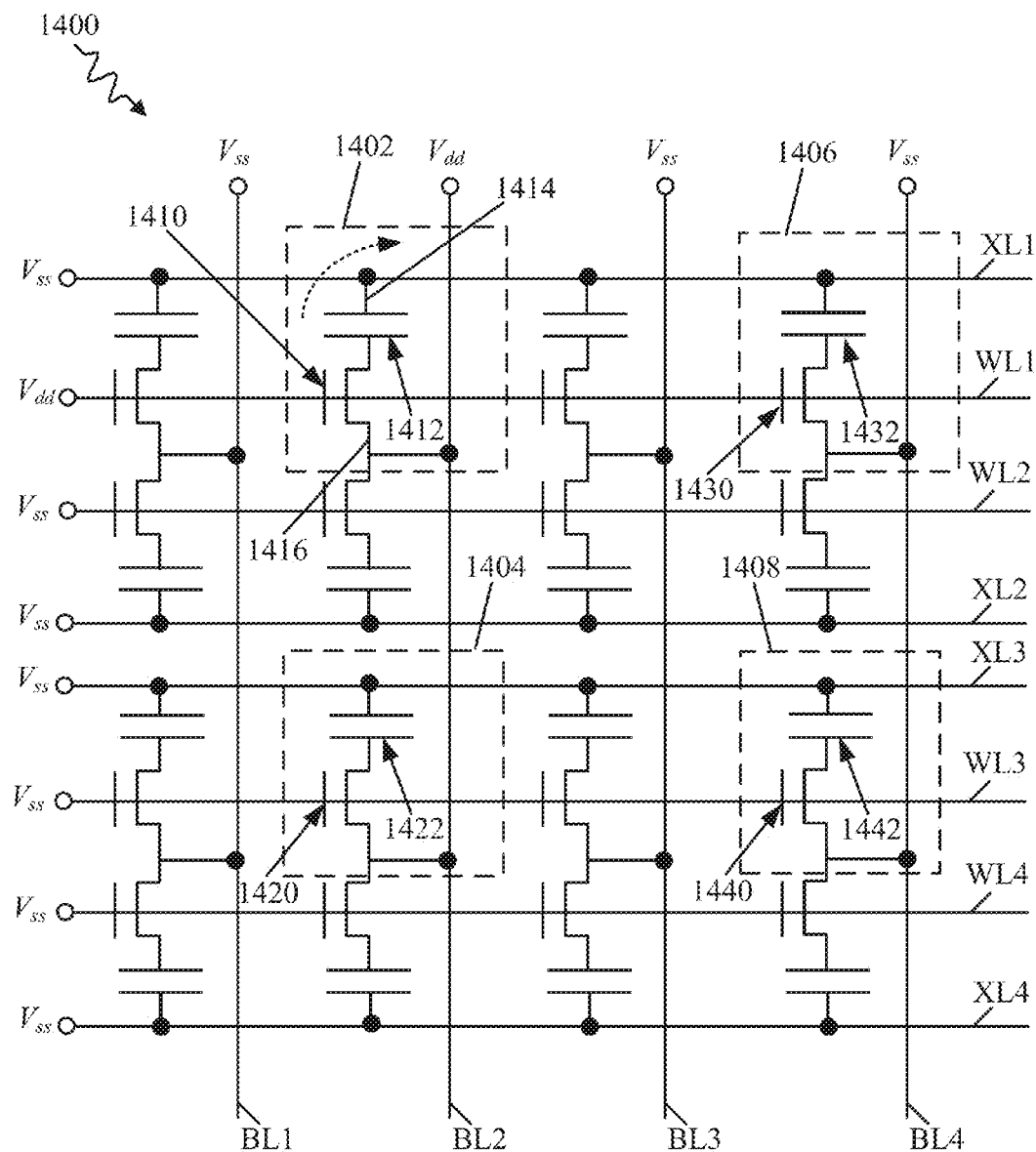

FIGS. 14 and 15 illustrate a schematic diagram of a programmable memory cell array 1400 according to another aspect of the present disclosure. The array 1400 is comprised of a plurality of programmable memory cells 1402, 1404, 1406, 1408 having antifuses as described herein. The "read" and "write" operations of the memory cells 1402, 1404, 1406, 1408 are controlled by the voltages applied to their respective bit lines (BL), word lines (WL), and select lines (XL). The memory cells 1402, 1404, 1406, 1408 may each be any one of the memory cells 1000, 1100, 1200, 1300 described with respect to FIGS. 10-13. The memory cells 1402, 1404, 1406, 1408 each comprise an access transistor 1410, 1420, 1430, 1440 and an antifuse 1412, 1422, 1432, 1442. The access transistors 1410, 1420, 1430, 1440 may be, for example, n-channel field effect transistors. The access transistors 1410, 1420, 1430, 1440 may be identical to the transistor 101 shown in FIGS. 10-13 and thus include the source 106, the drain 108, the gate 110, and the body 104. The antifuses 1412, 1422, 1432, 1442 may be any one of the antifuses 102, 302 shown in FIGS. 10-13. According to one aspect, the memory cells 1402, 1404, 1406, 1408 may be OTP memory cells where the antifuses 1412, 1422, 1432, 1442 may only change their state from an open circuit state to a closed circuit state once.

Referring to FIG. 14, a memory cell 1402 is undergoing a write operation (i.e., it is being programmed). In order to write a value (e.g., change the logical state from "0" to "1" or "1" to "0") of the memory cell 1402, various voltages at the terminals of the access transistor 1410 and the antifuse 1412 must be appropriately set. The voltage at the transistor's source 1416 is controlled by a bit line BL2, the voltage at the gate of the transistor 1410 is controlled by a word line WL1, and the voltage at one side 1414 (e.g., the top electrode 134 in FIGS. 10-13) of the antifuse 1412 is controlled by a select line XL1.

For example, as shown in FIG. 14, a value may be written by electrically coupling transistor's source 1416 to the ground reference voltage $V_{ss}$, setting the transistor's 1410 gate to the nominal supply voltage $V_{dd}$, and setting an antifuse's terminal 1414 (e.g., top electrode 134 in FIGS. 10-13) to the programming voltage $V_{pp}$. Note that the nominal supply voltage $V_{dd}$ is greater than the threshold voltage $V_{TH}$ of the transistor 1410. According to one aspect of the disclosure $V_{pp} > V_{dd}$, and $V_{pp}$ may be equal to the I/O voltage of the IC in which the memory cell array 1400 resides. Moreover, $V_{pp}$ is greater than the breakdown voltage $V_{BD}$ of the antifuse 1412. As just one example, $V_{pp}$ may be approximately 1.8 volts and $V_{dd}$ may be approximately 1.2 volts.

Applying the voltage $V_{dd}$ to the gate of the transistor 1410 causes the transistor 1410 to activate and become conductive assuming the body terminal of the transistor is grounded (i.e., an inversion layer is formed below the gate making substantial current flow between the source and the drain possible). Increasing the select line XL1 voltage to $V_{pp}$ causes the antifuse 1412 to transition from an open circuit state to a closed circuit state (i.e., the dielectric material within the antifuse 1412 ruptures) because the voltage across the antifuse 1412 $V_{pp}$ exceeds the breakdown voltage $V_{BD}$ of the antifuse's 1412 antifuse dielectric. The resulting conductive path across the antifuse 1412 makes current flow through XL1, BL2, and the transistor 1410 (as indicated by the curved, dashed arrow) possible if the BL2 voltage is less than the XL1 voltage, and the gate voltage of the transistor 1410 exceeds $V_{TH}$.

While the memory cell 1402 is undergoing a write operation (i.e. programming operation), the memory cell 1404 comprised of the transistor 1420 and antifuse 1422 is essentially inactive and no significant current flows through the transistor 1420 because the gate, the drain, and the source of the transistor 1420 are grounded. Similarly, the memory cell 1406 comprised of the transistor 1430 and the antifuse 1432 is also inactive and no significant current flows through the transistor 1430. Although the voltage of the gate of the transistor 1430 is at $V_{dd}$, no current flows through the transistor 1430 because both the source and the drain are grounded. Similarly, the memory cell 1408 comprised of the transistor 1440 and the antifuse 1442 is also inactive. Since the gate of the transistor 1440 is coupled to $V_{ss}$ the transistor 1440 is inactive and no significant current (i.e., besides negligible leakage current) may flow through the transistor (i.e., from source to drain) 1440.

Referring to FIG. 15, the memory cell 1402 is undergoing a "read" operation. In order to read a value (e.g., read the logical state "0" or "1") from the memory cell 1402, various voltages at the terminals of the transistor 1410 and the antifuse 1412 must be appropriately set. For example, as shown in FIG. 15, this may include setting the antifuse's terminal 1414 (e.g., the top electrode 134 in FIGS. 10-13) to $V_{ss}$, and setting the transistor's 1410 gate and drain 1416 to $V_{dd}$. (Note, that since BL2 has a greater voltage than XL1 in this example, the node 1416 is now the drain and the other side of the transistor 1410 is the source.) Applying the voltage $V_{dd}$ to the gate of the transistor 1410 causes the transistor 1410 to activate and become conductive. Increasing the BL2 voltage to $V_{dd}$ may cause current to flow through the antifuse 1412 and the transistor 1410 depending on the state of the antifuse 1412. For example, if the antifuse 1412 is in an open circuit state (e.g., it has not been programmed), then no significant current will flow through BL2 and XL1, which may represent a first logical state, such as "0." If the antifuse 1412 is in a conductive, closed circuit state (e.g., it has been programmed/written), then a significant amount of current will flow (as indicated by the dashed, curved arrow) through BL2 and XL1, which may represent a second logical state, such as "1."

While the memory cell 1402 is undergoing a read operation, memory cells 1404, 1406, and 1408 may be inactive because the gates voltages of their associated transistors 1420, 1430, 1440 may not exceed $V_{TH}$ and/or the voltage differential between their sources and drains is negligible. In this fashion, setting the voltages of the select lines to $V_{pp}$ and the bit lines to $V_{ss}$ may allow for programming of the memory cells 1402, 1404, 1406, 1408 while setting the voltages of the select lines to $V_{ss}$ and the bit lines to $V_{dd}$ may allow for reading of the memory cells 1402, 1404, 1406, 1408.

According to another aspect, the memory cells 1402, 1404, 1406, 1408 may be MTP memory cells where the antifuses 1412, 1422, 1432, 1442 may change their states from an open circuit state to a closed circuit state and back again to an open circuit state multiple times if the dielectric used within the antifuse 1412, 1422, 1432, 1442 is designed to form and break conductive paths multiple times based on the voltage applied across the dielectric. In such a case, the memory cells 1402, 1404, 1406, 1408 may be reprogrammed (i.e. re-written) by applying appropriate voltages to the terminals of the transistors 1410, 1420, 1430, 1440 and the antifuses 1412, 1422, 1432, 1442. For example, the memory cell 1402 may be reprogrammed to an open circuit state by applying a voltage $V_{dd}$ to the transistor's 1410 gate, to XL1, and $V_{pp}$ to the BL2. Moreover, BL1, BL3, and BL4 will have to be set to $V_{ss}$ to inactivate other memory cells within the array 1400 from unintentional programming.

According to one aspect, the first electrode 134, the antifuse dielectric 136, and/or the second electrode 304 may be planar as shown in FIGS. 1-7 and 10-13. According to another aspect, the first electrode 134, the antifuse dielectric 136, and/or the second electrode 304 may have a substantially rectangular cuboid shape.

Figure 16:
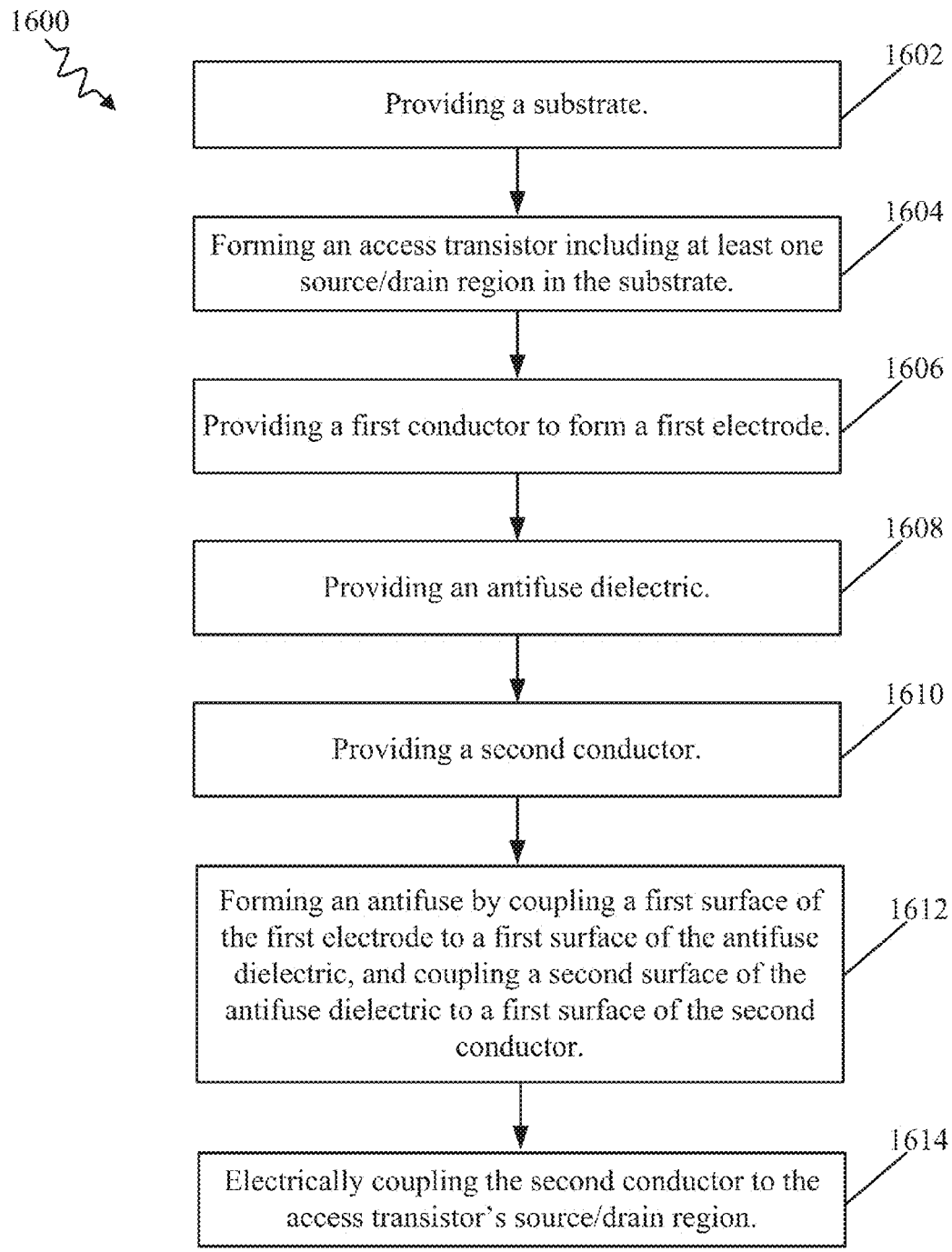
FIG. 16 illustrates a method of manufacturing an integrated circuit.

FIG. 16 illustrates a method 1600 of manufacturing an integrated circuit according to one aspect. At step 1602, the method comprises providing a substrate. At step 1604, the method further comprises forming an access transistor including at least one source/drain region in the substrate. At step 1606, the method further comprises providing a first conductor to form a first electrode. At step 1608, the method further comprises providing an antifuse dielectric. At step 1610, the method further comprises providing a second conductor. At step 1612, the method further comprises forming an antifuse by coupling a first surface of the first electrode to a first surface of the antifuse dielectric, and coupling a second surface of the antifuse dielectric to a first surface of the second conductor. At step 1614, the method further comprises electrically coupling the second conductor to the access transistor's source/drain region.

Figure 17:
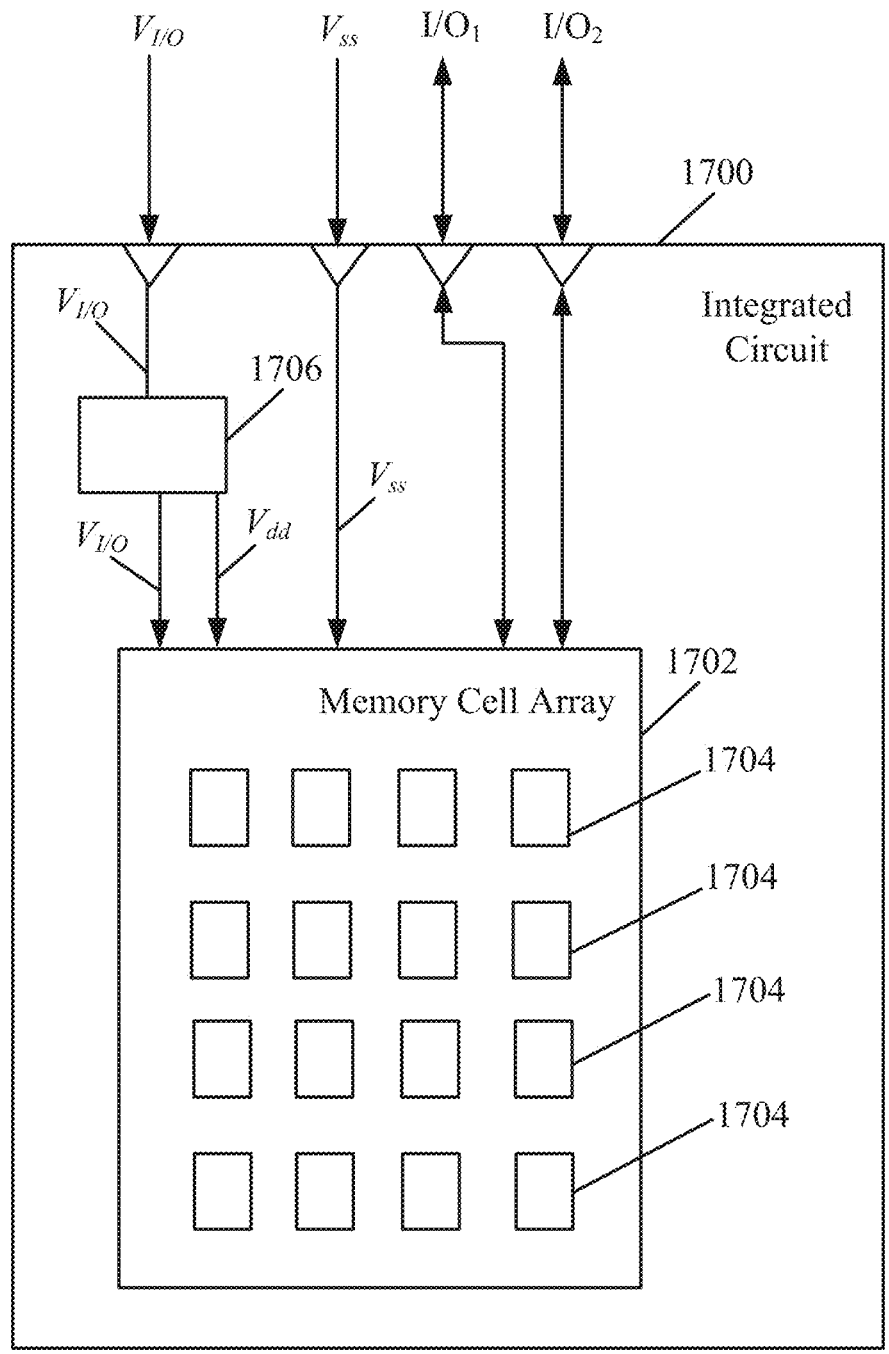
FIG. 17 illustrates a schematic block diagram of an integrated circuit.

FIG. 17 illustrates a schematic view of an integrated circuit 1700 according to one aspect of the present disclosure. The IC 1700 may include a memory cell array 1702 comprising a plurality of memory cells 1704. The memory cell array 1702 may be any of the memory cell arrays 800, 1400 described herein. The memory cells 1704 may be any of the OTP or MTP memory cells 100, 300, 400, 500, 1000, 1100, 1200, 1300 described herein. The IC 1700 may be externally supplied an I/O voltage $V_{I/O}$ that is used by the IC's voltage converter circuit 1706 to generate a nominal supply voltage $V_{dd}$ that is less than $V_{I/O}$. Both $V_{I/O}$ and $V_{dd}$ may be supplied to the memory cell array 1702 as shown. In other aspects, the IC 1700 may be externally supplied both $V_{I/O}$ and $V_{dd}$, and thus the IC 1700 does not have to generate $V_{dd}$ on-chip using a voltage converter circuit 1706. The IC 1700 may have one or more input/output (I/O) signal lines $I/O_1$, $I/O_2$.

IC Antifuses Featuring Increased Perimeter Edge Length

Figure 18:
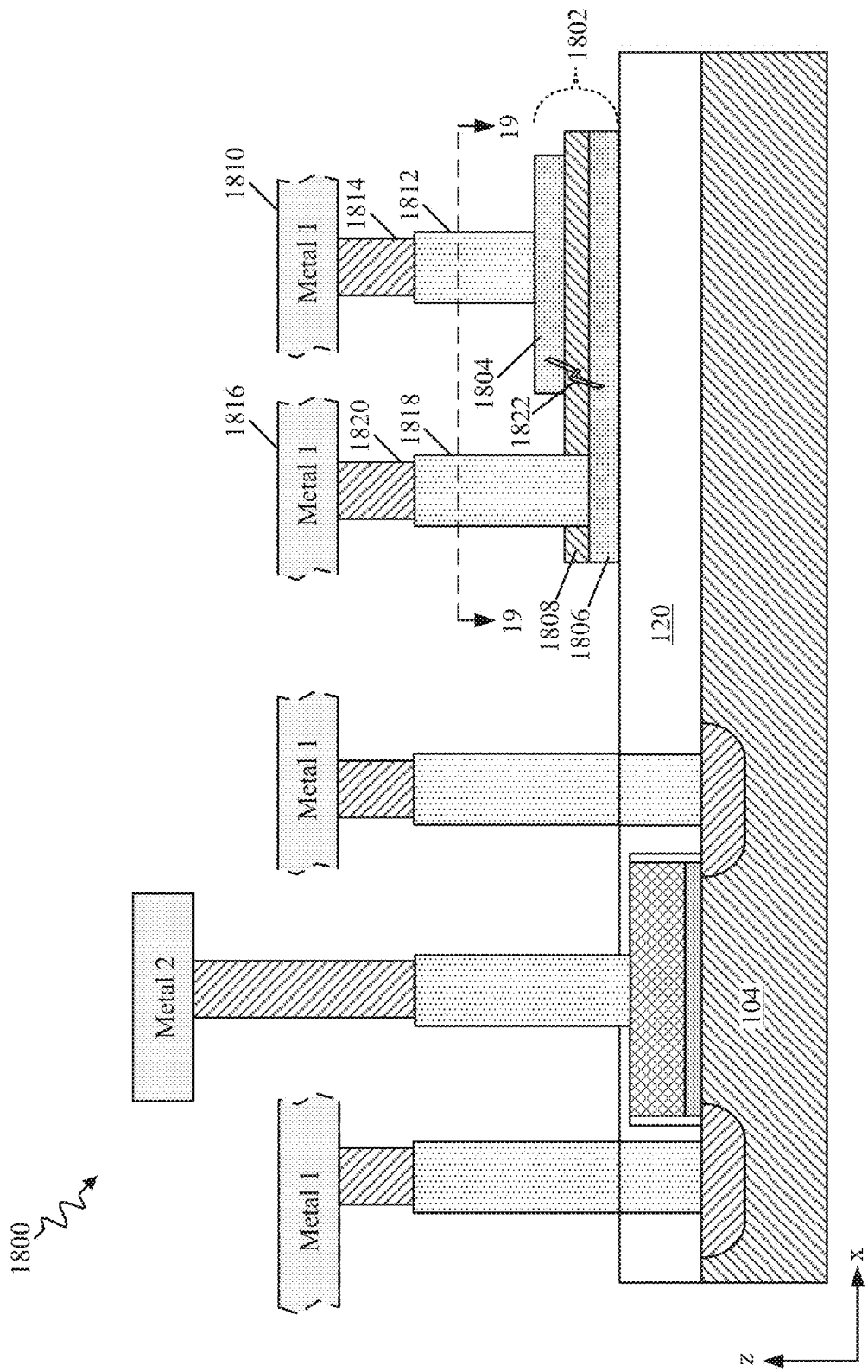
FIG. 18 illustrates a cross-sectional view of an IC featuring an antifuse.

FIG. 18 illustrates a cross-sectional view of an IC 1800 featuring an antifuse 1802 according to one aspect of the disclosure. The antifuse 1802 includes a top portion 1804 (herein also referred to as a "first conductor plate" or "top plate"), a bottom portion 1806 (herein also referred to as a "second conductor plate" or "bottom plate"), and an antifuse dielectric layer 1808. The top plate 1804 is electrically coupled to a metal layer 1810 through one or more interconnects 1812 and/or vias 1814. The bottom plate 1806 is similarly connected to the same and/or a different metal layer 1816 through one or more interconnects 1818 and/or vias 1820.

The antifuse 1802 has a conductor-insulator-conductor structure. The top and bottom plates 1804, 1806 may be made of any conductive material including but not limited to any metal, metal alloy, and/or polycrystalline silicon ("polysilicon"). For example, the top and bottom plates 1804, 1806 may be polysilicon, aluminum, copper, gold, platinum, titanium, titanium nitride (TiN), tantalum, tantalum nitride (TaN), or any other metal/metal-alloy. The dielectric layer 1808 may be composed of any insulator material including but not limited to silicon nitride (SiN), silicon dioxide (SiO$_2$), and hafnium oxide.

A voltage differential applied to the top and bottom plates 1804, 1806 that exceeds the breakdown voltage $V_{BD}$ of the antifuse dielectric layer 1808 causes the antifuse 1802 to transition from an open circuit state to a closed circuit state. The voltage level necessary to transition the antifuse 1802 from the open circuit state to the closed circuit state is the programming voltage $V_{PP}$, of the antifuse 1802. When the dielectric layer 1808 breaks down (i.e., antifuse transitions from an open to a closed circuit state) short channels 1822 may form that allow a conductive path between the top and bottom plates 1804, 1806. It is impossible to predict exactly where such channels 1822 may form, but as described below, they may be more likely to occur near the edges of the antifuse's top plate 1804.

Figure 19:
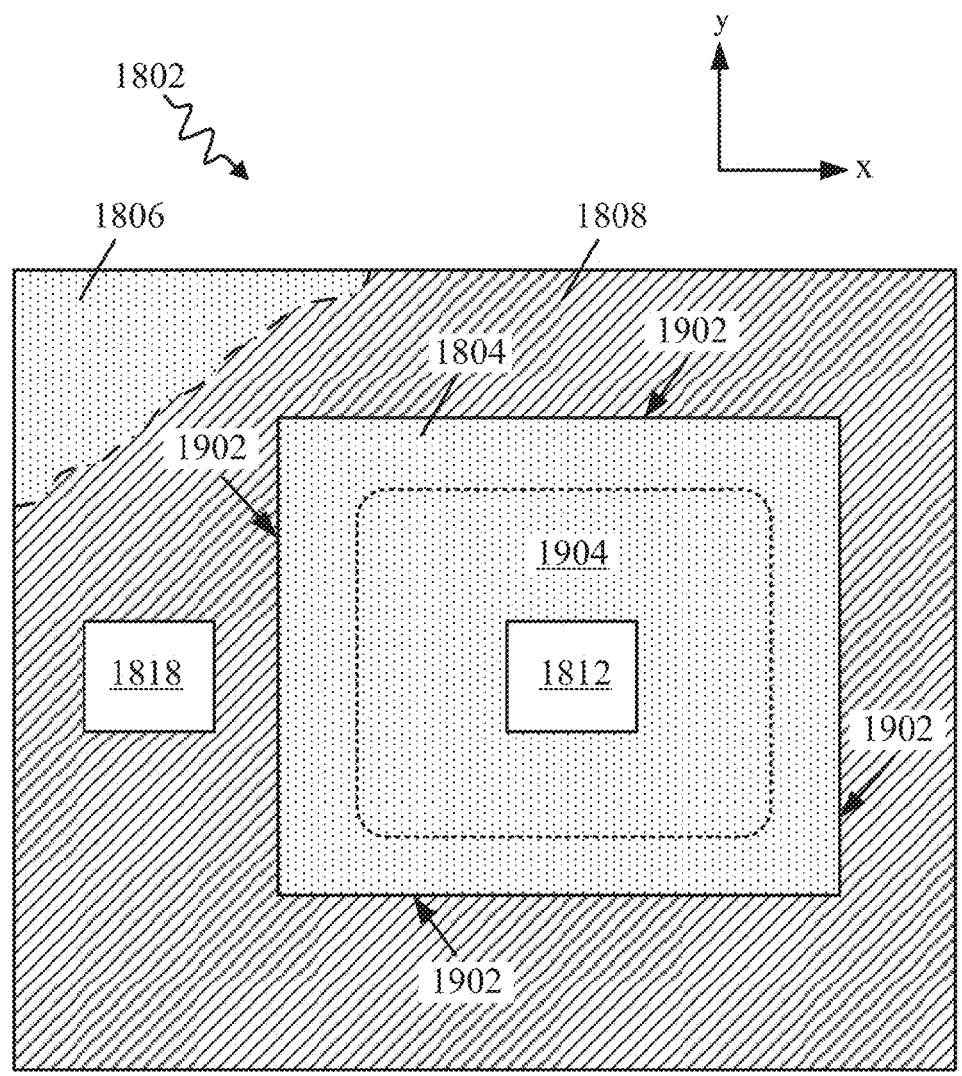
FIGS. 19 and 20 illustrate top views of an IC featuring an antifuse.
Figure 20:
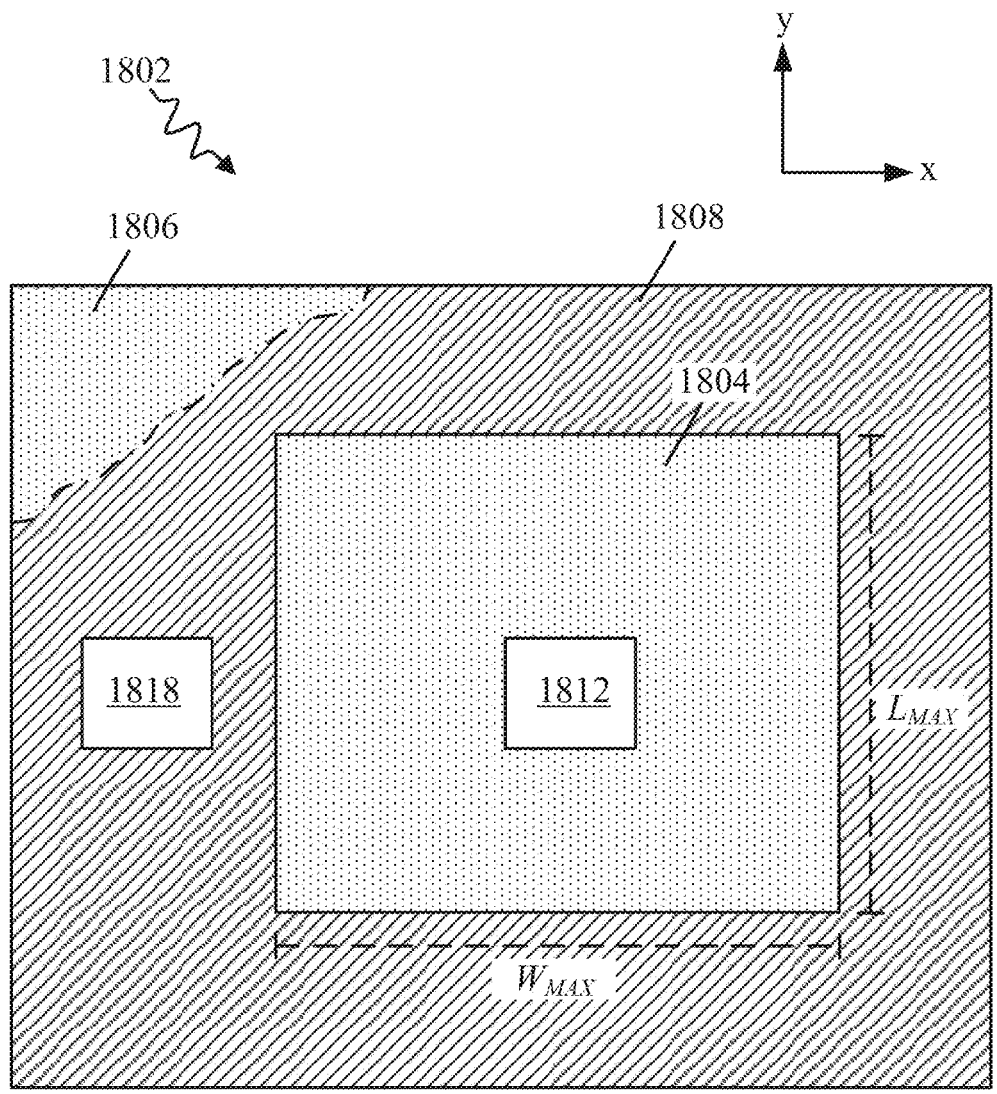

FIG. 19 is a top view of the antifuse 1802 along the line 19-19 (see FIG. 18). The top plate 1804 includes edges 1902 and an interior region 1904 (generally shown by the area within the dashed line). FIG. 20, which also shows a top view of the antifuse 1802 along the line 19-19, illustrates how the antifuse's top plate 1804 has a maximum width $W_{MAX}$ and a maximum length $L_{MAX}$. Thus, in the example shown in FIGS. 19 and 20, the top plate 1804 has a total edge length $L_{TE}=2*(W_{MAX}+L_{MAX})$.

Generally, the maximum width $W_{MAX}$ for an antifuse top plate is the measure of the widest point of the top plate along a first axis (e.g., x-axis), and the maximum length $L_{MAX}$ for an antifuse top plate is the measure of the longest point of the top plate along a second axis (e.g., y-axis). (See FIGS. 19-21, 23-25, 27, and 29). The first axis is perpendicular to the second axis, and the first axis and the second axis are in the plane of the top surface (e.g., surfaces 2205, 2505, 2705, 2905) of the top plate. A third axis (e.g., z-axis) is perpendicular to both the first axis and the second axis, and consequently is perpendicular to the top surface of the top plate. Examples of the maximum width $W_{MAX}$ and the maximum length $L_{MAX}$ are shown in the figures related to the examples described herein.

Referring to FIG. 19, due to imperfect manufacturing processes in forming/patterning the top plate 1804, regions of the dielectric layer 1808 right underneath the top plate's edges 1902 will have significantly more damage, thinness, and/or weakness due to over-etching than other portions of the dielectric layer 1808 such as portions underneath the interior region 1904 of the top plate 1804 where the dielectric layer 1808 is much more uniform. This damage/thinness of the dielectric layer 1808 underneath the top plate's edges 1902 increases the likelihood that the antifuse's dielectric layer 1808 will breakdown (e.g., short channels 1822 will form) underneath a point at or near the top plate's edges 1902 versus at a point underneath the top plate's interior region 1904. This increased likelihood also means that the effective breakdown voltage $V_{BD}$ of the antifuse's dielectric layer 1808 at or near the top plate's edges 1902 is on average lower than points underneath the top plate's interior region 1904.

Consequently, increasing the length of the top plate's edges 1902 (and/or adding edges to the top plate's 1804 interior region 1904) relative to the top plate's 1804 area increases the probability that the antifuse 1802 will breakdown at or near an edge 1902. For example, increasing the length of the top plate's total edge length $L_{TE}$ 1902 while decreasing the top plate's area (e.g., $W_{MAX}*L_{MAX}$) increases the probability that the antifuse 1802 will breakdown at or near the top plate edges 1902 instead of at some point within the top plate's interior region 1904 (i.e., a region away from the top plate perimeter edge). And as stated above, since the breakdown voltage $V_{BD}$ of the antifuse dielectric 1808 along the edges 1902 is on average less than points underneath the top plate's interior region 1904, increasing the length of the top plate's total edge length $L_{TE}$ 1902 relative to the top plate's 1804 area also effectively lowers the overall programming voltage $V_{PP}$ of the antifuse 1802. Another observation is that increasing the total edge length $L_{TE}$ beyond $2*(W_{MAX}+L_{MAX})$, which is the $L_{TE}$ of a rectangular-shaped top plate (e.g., top plate 1804), while maintaining the same top plate footprint area (e.g., $W_{MAX}*L_{MAX}$) also increases the probability of breakdown at the edges and also lowers the overall programming voltage $V_{PP}$ of the antifuse 1802. Some non-limiting examples of patterns (e.g., "comb" patterns of FIGS. 21, 24, 25) that increase the total edge length $L_{TE}$ relative to the top plate area and/or the top plate footprint area (e.g., $W_{MAX}*L_{MAX}$) are described below.

Figure 21:
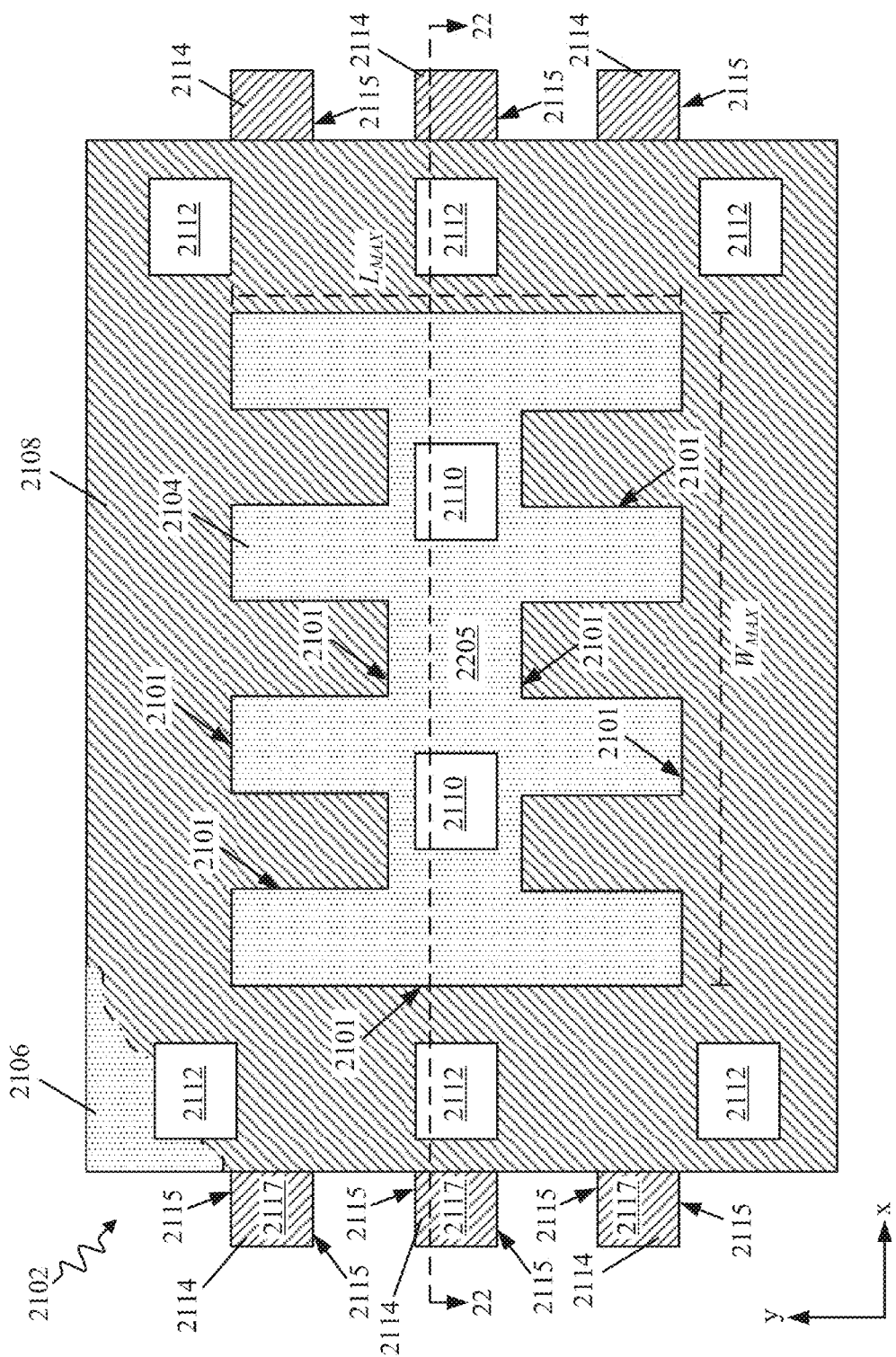
FIGS. 21 and 23 illustrate top views of a first exemplary IC antifuse having a patterned top conductor plate.
Figure 22:
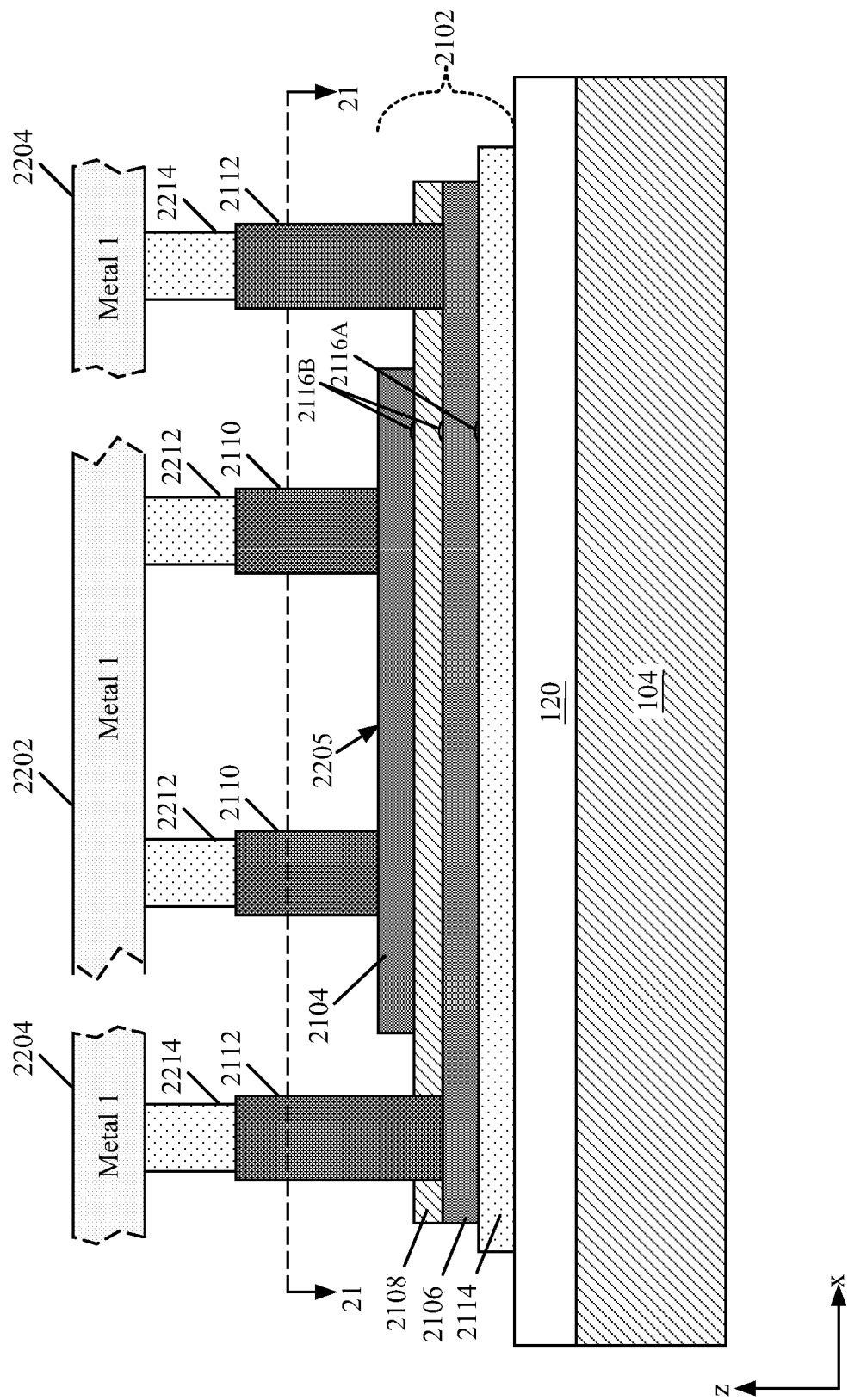
FIG. 22 illustrates a cross-sectional view of the first exemplary IC antifuse.

FIG. 21 illustrates a top view of an IC antifuse 2102 having a conductor-insulator-conductor structure according to another aspect of the disclosure. FIG. 22 illustrates a cross-sectional view of the antifuse 2102 along the line 22-22 (see FIG. 21). Similar to the antifuse 1802 shown in FIGS. 18-20, the antifuse 2102 illustrated in FIGS. 21 and 22 includes a top plate 2104, a bottom plate 2106, and a dielectric layer 2108 interposed between the plates 2104, 2106, and the antifuse top plate 2104 has a maximum width $W_{MAX}$ and a maximum length $L_{MAX}$. However, despite having the same maximum width $W_{MAX}$ and maximum length $L_{MAX}$ as the rectangular top plate 1804 of the antifuse depicted in FIGS. 18-20, the top plate 2104 shown in FIG. 21 has a greater total edge length $L_{TE}$ 2101. Moreover, the top plate 2104 has a greater ratio between its $L_{TE}$ and its top surface area $S_{TP}$ (e.g., area of top plate's top surface 2205) than the top plate 1804 of FIGS. 18-20.

Referring to FIGS. 21 and 22, the top plate 2104 is electrically coupled to a metal layer 2202 through one or more interconnects 2110 and/or vias 2212. The bottom plate 2106 is similarly connected to the same and/or a different metal layer 2204 through one or more interconnects 2112 and/or vias 2214. A voltage differential applied to the top and bottom plates 2104, 2106 that exceeds the breakdown voltage $V_{BD}$ of the antifuse dielectric layer 2108 causes the antifuse 2102 to transition from an open circuit state to a closed circuit state. The voltage level necessary to transition the antifuse 2102 from the open circuit state to the closed circuit state is the programming voltage $V_{PP}$ of the antifuse 2102.

The antifuse 2102 may optionally also include one or more bottom metal lines 2114 to help reduce the antifuse programming voltage $V_{PP}$ (e.g., the overall breakdown voltage $V_{BD}$ of the antifuse 2102 is lowered). The bottom metal lines 2114 are underneath and in contact with the bottom plate 2106 as shown in FIGS. 21 and 22. When the bottom metal lines 2114 are formed, there is surface variation of the metal 2114 due to the different material hardness between the metal lines 2114 and the oxide (e.g., insulator 120 and/or substrate 104) on which the metal lines 2114 are formed. Consequently, the surface 2117 of the metal lines 2117 may not be smooth and even, especially at the edges 2115 of the metal lines 2114, and thus a hump of metal (e.g., 2116A) may be present along the metal line edges 2115 after chemical-mechanical planarization (CMP). These surface irregularities and/or humps (e.g., edge hump(s)) are in turn transferred (e.g., 2116B) to the additional layers, such as the bottom plate 2106, the dielectric layer 2108, and the top plate 2104, that are formed on top of the metal lines 2114. That is, surface roughness and/or humps (e.g., topograph) may be present on the bottom plate 2106, dielectric layer 2108, and/or the top plate 2104 at regions directly above the underlying metal lines edges 2115 where the metal line humps are. The resulting surface roughness and/or humps that propagate through the upper layers 2106, 2108, 2104 cause further weakness at such points (e.g., at the dielectric layer 2108) and the antifuse 2102 dielectric layer 2108 is more likely to breakdown at these points (e.g., $V_{BD}$ on average may be lower at these points of irregularity). For example, regions of the dielectric layer 2108 that are at and/or near the top plate edge 2101 and/or are above an underlying metal line edge 2115 may be particularly weak and have a significantly lower breakdown voltage $V_{BD}$.

In the examples shown herein, three (3) bottom metal lines 2114 are illustrated. However, any number of bottom metal lines 2114 may be placed underneath the bottom plate 2106, including more than three (3). According to one aspect, the plurality of metal lines are each oriented parallel to one another and have a length greater than at least one of the maximum length $L_{MAX}$ and/or the maximum width $W_{MAX}$ of the antifuse top plate (e.g., any of the top plates 2104, 2404, 2504, 2704, 2904 described herein). According to one example, one (1) large metal line that is as wide and/or long as the bottom plate 2106 itself may be implemented. According to another example, the bottom metal lines 2114 may be as wide and/or as long as the top plate 2104. According to yet another example, the bottom metal lines 2114 may be wider and/or longer than the top plate 2104.

Figure 23:
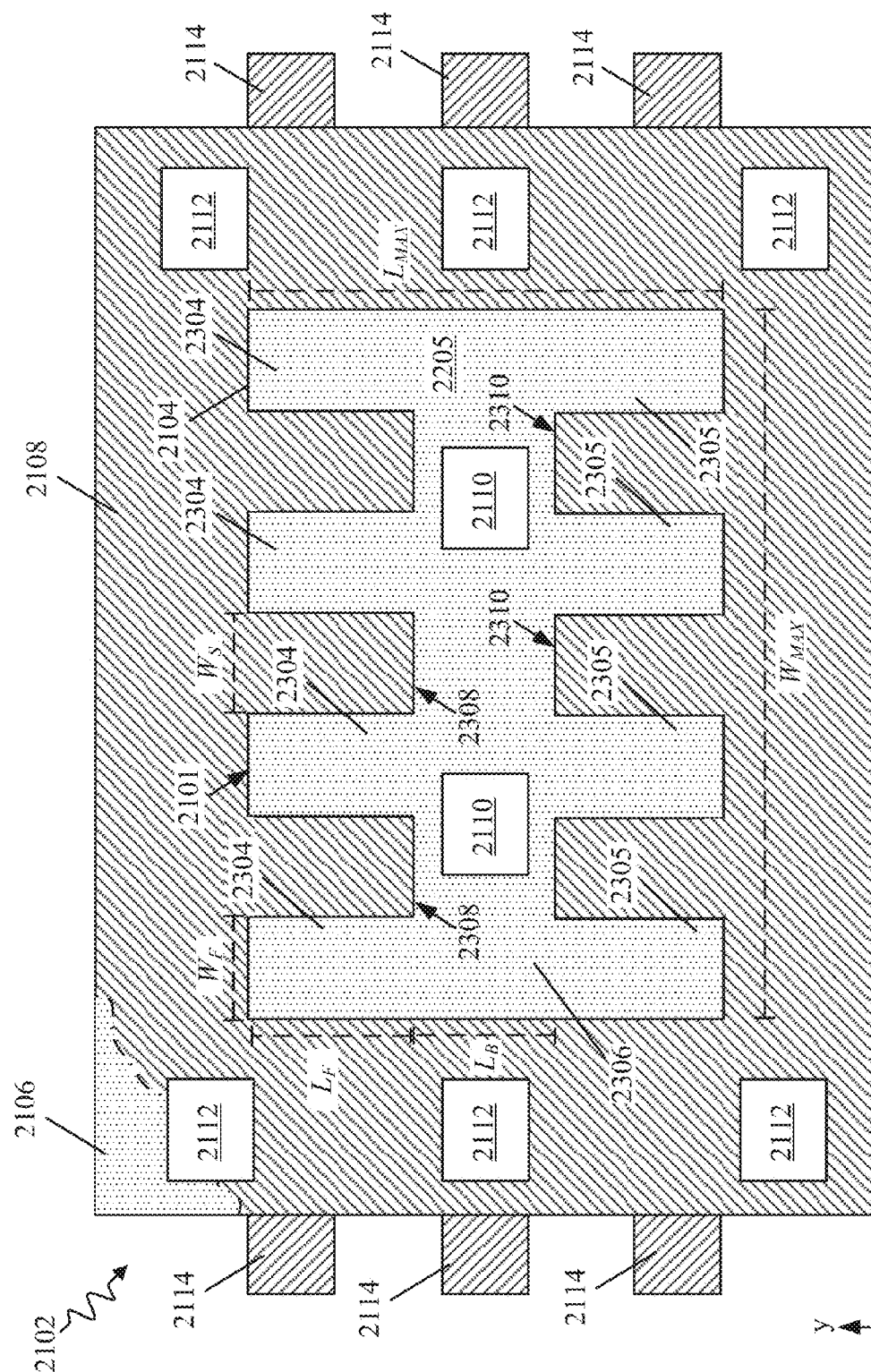

FIG. 23 also illustrates a top view of the antifuse 2102. In particular, FIG. 23 shows the sizes of the various edges of the planar top plate 2104 that make up the total edge length $L_{TE}$ 2101. The top plate 2104 has a first body portion 2306 and a first plurality of "fingers" 2304 that extend out laterally from a first side 2308 of the first body portion 2306. The top plate 2104 also has a second plurality of fingers 2305 that extend out laterally from a second, opposite side 2310 of the first body portion 2306. Based on one example, the top plate 2104 has an equal number of fingers 2304, 2305 on its two sides 2308, 2310. The fingers 2304, 2305 may be rectangular and have a length $L_F$ and a width $W_F$. The fingers 2304, 2305 may be positioned such that they are lengthwise perpendicular to the first body portion's first and second sides 2308, 2310. The fingers 2304, 2305 are spaced apart a distance $W_S$. The first body portion 2306 has a length $L_B$ and a width $W_{MAX}$. According to one non-limiting example, $L_B$ may equal $W_F$.

In the illustrated example, the top plate 2104 has eight (8) total fingers 2304, 2305 and the perimeter edge length $L_{TE}$ 2101 is given by equation (1):

$$L_{TE}=2*L_{MAX}+12*L_F+6*W_S+8*W_F \quad (1).$$

However, the pattern of the top plate 2104 shown in FIG. 23 is not limited to eight (8) fingers 2304, 2305 and may have any number of fingers 2304, 2305 greater than or equal to four (4). Thus, for a total number of fingers N (where N≥4) the total edge length $L_{TE}$ 2101 is given by equations (2) and (3):

$$L_{TE}=2*L_B+2*N*L_F+N*W_F+(N-2)*W_S \quad (2);$$

$$L_{TE}=2*(L_{MAX}+W_{MAX})+2*(N-2)*L_F \quad (3).$$

As described above with respect to FIGS. 19 and 20, a rectangular top plate 1804 having no fingers has a total edge length $L_{TE}=2*(L_{MAX}+W_{MAX})$. Thus, for N total fingers the top plate 2104 of FIGS. 21-23 has a total edge length $L_{TE}$ that is greater than the rectangular top plate 1804 by $2*(N-2)*L_F$. For example, if N=8 and $W_F=W_S=L_B=0.5*L_F$, then the total edge length $L_{TE}$ of the patterned top plate 2104 is 100% longer than the total edge length $L_{TE}$ for the rectangular top plate 1804 having the same maximum width $W_{MAX}$ and length $L_{MAX}$ (e.g., $W_{MAX}=7*W_F$ and $L_{MAX}=5*W_F$). Therefore, it may be observed that while the top plate's 2104 footprint area has stayed the same at $W_{MAX}*L_{MAX}$, the total edge length $L_{TE}$ has increased by $2*(N-2)*L_F$.

Moreover, as compared to the rectangular top plate 1804, the patterned top plate's 2104 total edge length $L_{TE}$ has increased by $2*(N-2)*L_F$ and its surface area $S_{TP}$ 2205 has decreased by $(N-2)*W_S*L_F$. Therefore the ratio between its total edge length $L_{TE}$ and its surface area $S_{TP}$ has increased.

Figure 24:
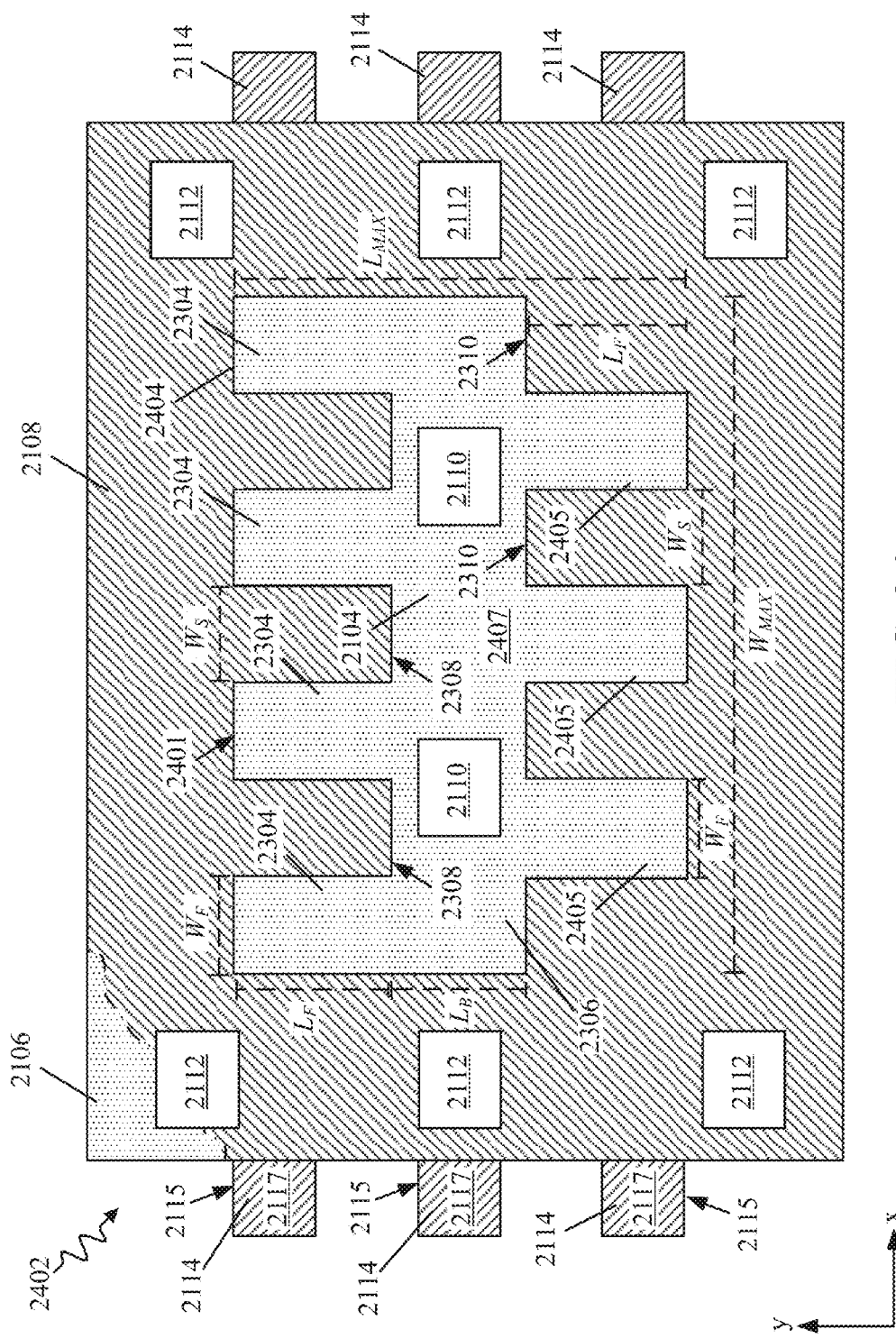
FIG. 24 illustrates a top view of a second exemplary IC antifuse having a patterned top conductor plate.

FIG. 24 illustrates a top view of an IC antifuse 2402 having a conductor-insulator-conductor structure according to another aspect of the disclosure. The antifuse 2402 is similar to the antifuse 2102 shown in FIGS. 21-23 except that the antifuse 2402 of FIG. 24 has a top plate 2404 that has an odd number of total fingers 2304, 2405. For example, the top plate 2404 also has the first body portion 2306 and the first plurality of fingers 2304 that extend out laterally from a first side 2308 of the first body portion 2306. The top plate 2104 also has a second plurality of fingers 2405 that extend out laterally from the second, opposite side 2310 of the first body portion 2306. However, the second plurality of fingers may have one less finger than the first plurality of fingers and may be positioned in a staggered fashion relative to the first plurality of fingers as shown in FIG. 24. The fingers 2304, 2405 may be rectangular and have a length $L_F$ and a width $W_F$. The fingers 2304, 2405 may be positioned such that they are lengthwise perpendicular to the first body portion's first and second sides 2308, 2310. The fingers 2304, 2405 are spaced apart a distance $W_S$.

In the illustrated example, the top plate 2104 has seven (7) total fingers 2304, 2405 and the total edge length $L_{TE}$ 2401 is given by equation (4):

$$L_{TE}=2*L_{MAX}+10*L_F+7*W_S+7*W_F \quad (4).$$

However, the pattern of the top plate 2404 shown in FIG. 24 is not limited to seven (7) fingers 2304, 2405 and may have any odd number of fingers 2304, 2405 greater than or equal to three (3). Thus, for a total number of fingers N (where N≥3) the total edge length $L_{TE}$ 2401 is given by equations (5) and (6):

$$L_{TE}=2*L_B 2*N*L_F+N*W_F N*W_S \quad (5);$$

$$L_{TE}=2*(L_{MAX}+W_{MAX})+2*(N-2)*L_F \quad (6).$$

As described above with respect to FIGS. 19 and 20, a rectangular top plate 1804 having no fingers has a total edge length $L_{TE}=2*(L_{MAX}+W_{MAX})$. Thus, for N total fingers the top plate 2404 of FIG. 24 has a total edge length $L_{TE}$ that is greater than the rectangular top plate 1804 by $2*(N-2)*L_F$. For example, if N=7 and $W_F=W_S=L_B=0.5*L_F$, then the total edge length $L_{TE}$ of the patterned top plate 2404 is 86.67% longer than the total edge length $L_{TE}$ for the rectangular top plate 1804 having the same maximum width $W_{MAX}$ and length $L_{MAX}$ (e.g., $W_{MAX}=7*W_F$ and $L_{MAX}=5*W_F$). Therefore, it may be observed that while the top plate's 2404 footprint area has stayed the same at $W_{MAX}*L_{MAX}$, the total edge length $L_{TE}$ has increased by $2*(N-2)*L_F$.

Moreover, as compared to the rectangular top plate 1804, the patterned top plate's 2404 total edge length $L_{TE}$ has increased by $2*(N-2)*L_F$ and its surface area $S_{TP}$ 2407 has decreased by $N*W_S*L_F$. Therefore the ratio between its total edge length $L_{TE}$ and its surface area $S_{TP}$ has increased.

Figure 25:
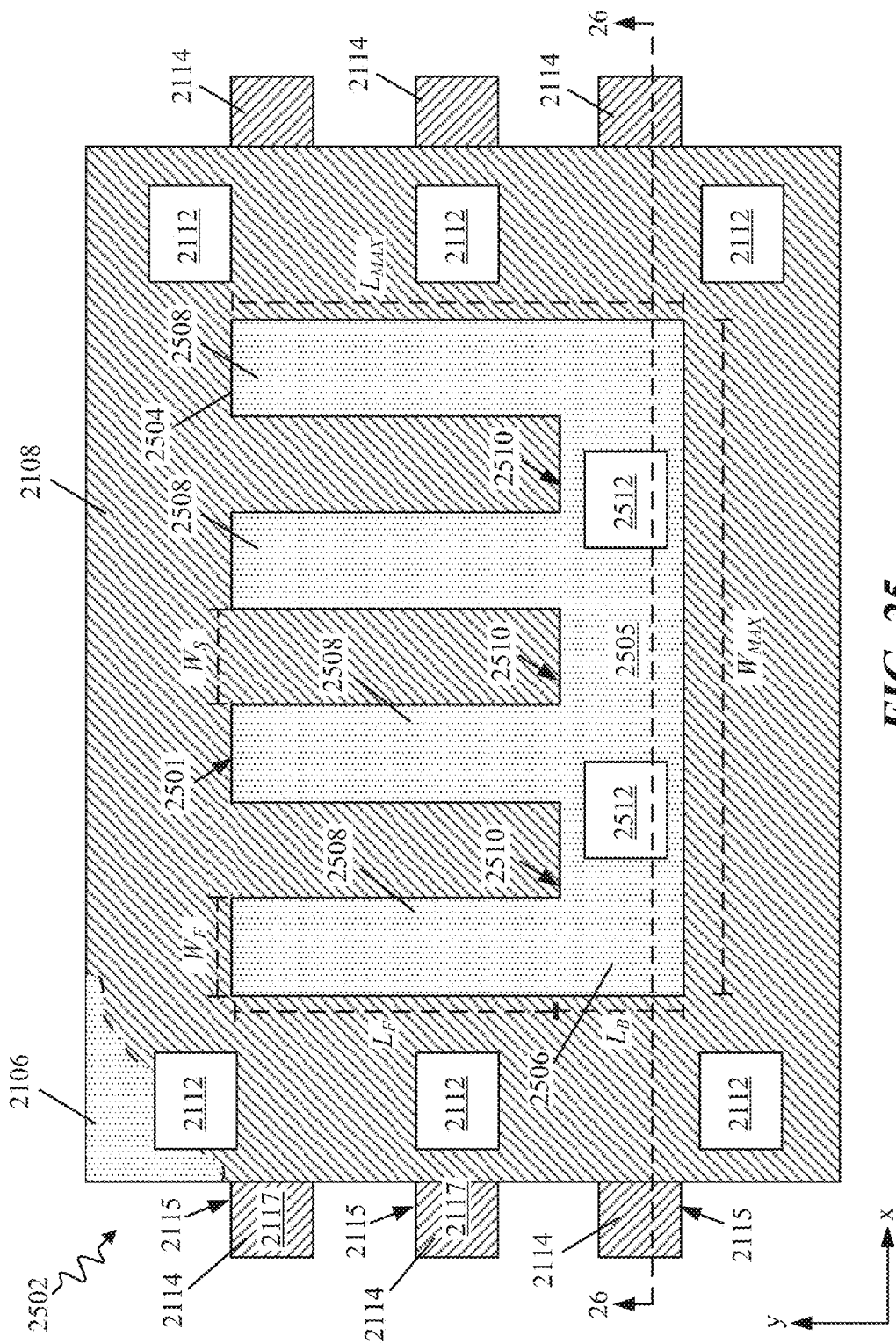
FIG. 25 illustrates a top view of a third exemplary IC antifuse hazing a patterned top conductor plate.
Figure 26:
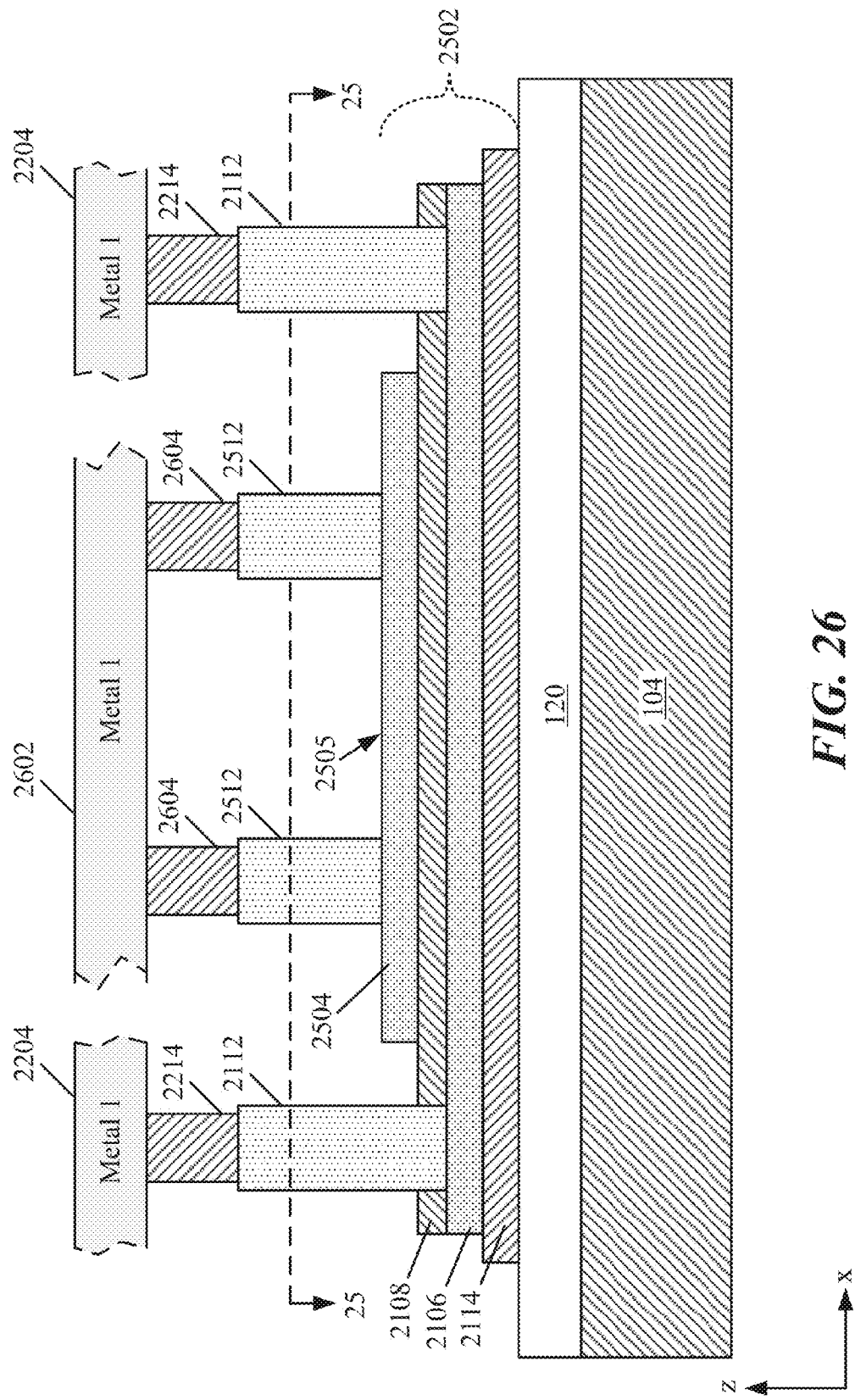
FIG. 26 illustrates a cross-sectional view of the third exemplary IC antifuse.

FIG. 25 illustrates a top view of an IC antifuse 2502 having a conductor-insulator-conductor structure according to another aspect of the disclosure. FIG. 26 illustrates a cross-sectional view of the antifuse 2502 along the line 26-26 (see FIG. 25). Similar to the antifuse 1802 shown in FIGS. 18-20, the antifuse 2502 illustrated in FIGS. 25 and 26 includes a top plate 2504, a bottom plate 2106, and a dielectric layer 2108 interposed between the plates 2504, 2106, and the antifuse top plate 2504 has a maximum width $W_{MAX}$ and a maximum length $L_{MAX}$. However, despite having the same maximum width $W_{MAX}$ and maximum length $L_{MAX}$ as the rectangular top plate 1804 of the antifuse depicted in FIGS. 18-20, the top plate 2504 shown in FIG. 25 has a greater total edge length $L_{TE}$ 2501. Moreover, the top plate 2504 has a greater ratio between its total edge length $L_{TE}$ and its top surface area $S_{TP}$ 2505 than the top plate 1804 of FIGS. 18-20.

Referring to FIGS. 25 and 26, the top plate 2504 is electrically coupled to a metal layer 2602 through one or more interconnects 2512 and/or vias 2604. The bottom plate 2106 is similarly connected to the same and/or a different metal layer 2204 through one or more interconnects 2112 and/or vias 2214. A voltage differential applied to the top and bottom plates 2504, 2106 that exceeds the breakdown voltage $V_{BD}$ of the antifuse dielectric layer 2108 causes the antifuse 2502 to transition from an open circuit state to a closed circuit state. The voltage level necessary to transition the antifuse 2502 from the open circuit state to the closed circuit state is the programming voltage $V_{PP}$ of the antifuse 2502.

The antifuse 2502 may also optionally include the one or more bottom metal lines 2114 that, as described above, help reduce the antifuse programming voltage $V_{PP}$ (e.g., the overall breakdown voltage $V_{BD}$ of the antifuse 2502 is lowered). Although FIG. 25 shows three (3) metal lines 2114, any number of bottom metal lines 2114 may be formed underneath the bottom plate 2106. According to one example, the bottom metal lines 2114 may be as wide and/or as long as the top plate 2504. According to another example, the bottom metal lines 2114 may be wider and/or longer than the top plate 2504.

Referring to FIG. 25, the top plate 2504 has a body portion 2506 and a plurality of fingers 2508 that extend out laterally from a first side 2510 of the body portion 2506. The fingers 2508 may be rectangular and have a length $L_F$ and a width $W_F$, and be spaced apart from one another a distance $W_S$. According to one non-limiting example, $W_S$ may equal $W_F$. According to another non-limiting example, the length $L_F$ may equal $2*W_F$. The fingers 2508 may be positioned such that they are lengthwise perpendicular to the body portion's first side 2510. The body portion 2506 has a length $L_B$ and a width $W_{MAX}$. According to one non-limiting example, $L_B$ may equal $W_F$.

In the illustrated example, the top plate 2504 has four (4) total fingers 2508 and the total edge length $L_{TE}$ 2501 is given by equation (7):

$$L_{TE}=2*L_{MAX}+W_{MAX}+6*L_F+3*W_S+4*W_F \qquad (7).$$

However, the pattern of the top plate 2504 shown in FIG. 25 is not limited to four (4) fingers 2508 and may have any number of fingers 2508 greater than or equal to two (2). Thus, for a total number of fingers N (where N≥2) the total edge length $L_{TE}$ 2501 is given by equations (8) and (9):

$$L_{TE}=2*L_B+2*N*L_F+W_{MAX}+N*W_F+(N-1)*W_S \qquad (8);$$

$$L_{TE}=2*(L_{MAX}+W_{MAX})+2*(N-1)*L_F \qquad (9).$$

As described above with respect to FIGS. 19 and 20, a rectangular top plate 1804 having no fingers has a total edge length $L_{TE}=2*(L_{MAX}+W_{MAX})$. Thus, for N total fingers the top plate 2504 of FIGS. 25 and 26 has a total edge length $L_{TE}$ that is greater than the rectangular top plate 1804 by $2*(N-1)*L_F$. For example, if N=4 and $W_F=W_S=L_B=0.25*L_F$, then the total edge length $L_{TE}$ of the patterned top plate 2504 is 100% longer than the total edge length $L_{TE}$ for the rectangular top plate 1804 having the same maximum width $W_{MAX}$ and length $L_{MAX}$ (e.g., $W_{MAX}=7*W_F$ and $L_{MAX}=5*W_F$). Therefore, it may be observed that while the top plate's 2504 footprint area has stayed the same at $W_{MAX}*L_{MAX}$, the total edge length $L_{TE}$ has increased by $2*(N-1)*L_F$.

Moreover, as compared to the rectangular top plate 1804, the patterned top plate's 2504 total edge length $L_{TE}$ has increased by $2*(N-1)*L_F$ and its surface area $S_{TP}$ 2505 has decreased by $(N-1)*W_S*L_F$. Therefore the ratio between its total edge length $L_{TE}$ and its surface area $S_{TP}$ has increased.

Figure 27:
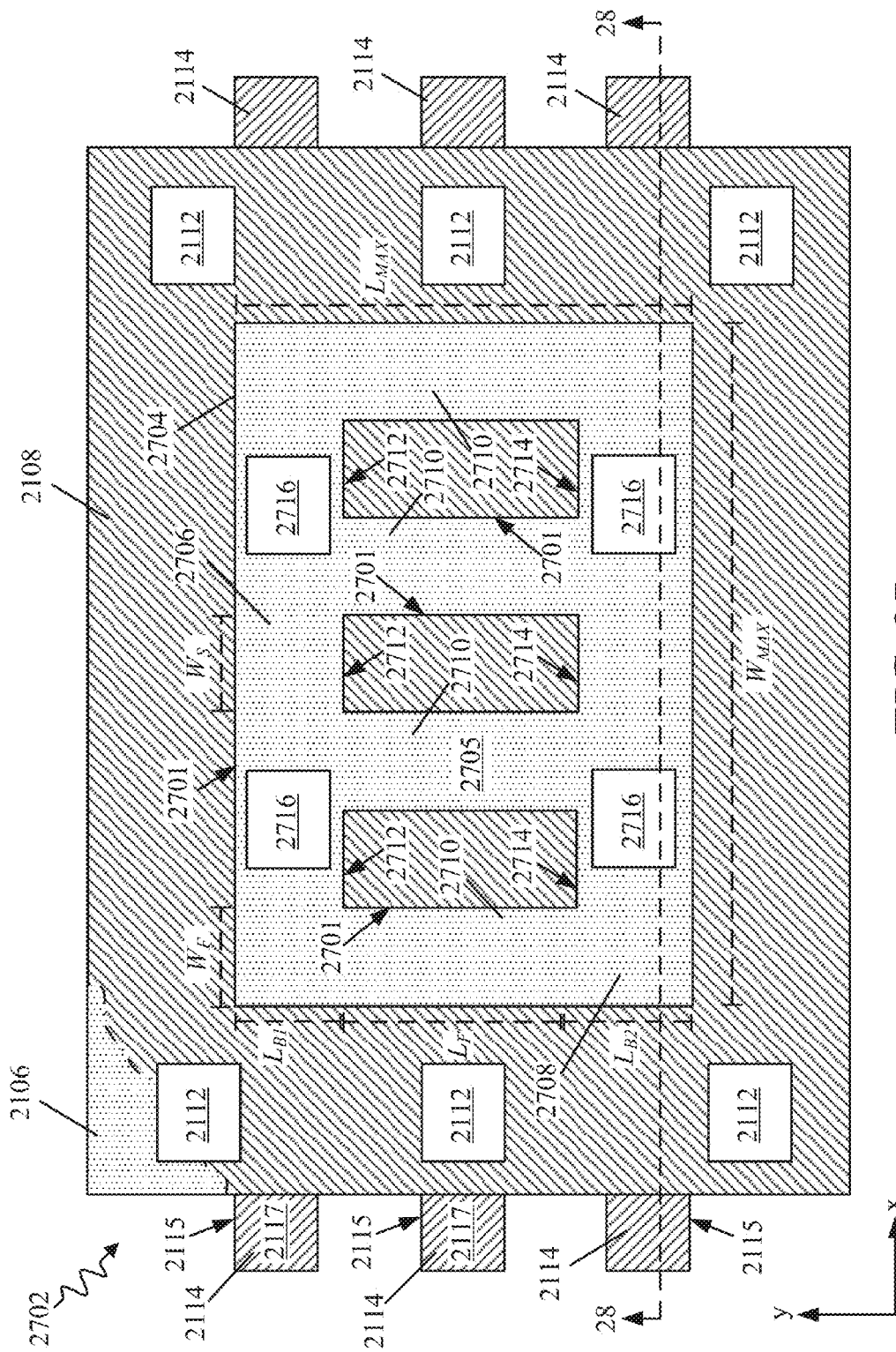
FIG. 27 illustrates a top view of a fourth exemplary IC antifuse having a patterned top conductor plate.
Figure 28:
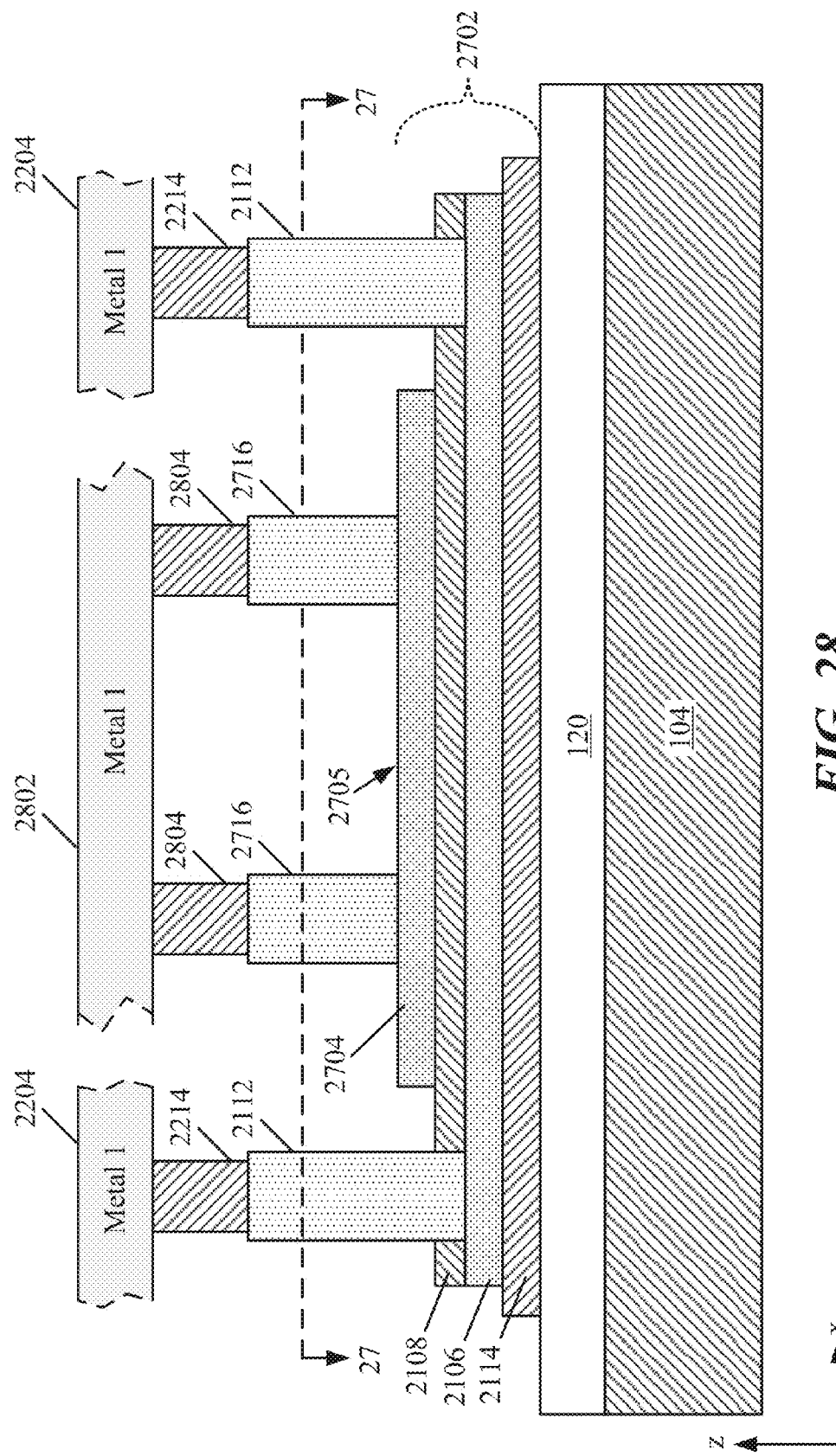
FIG. 28 illustrates a cross-sectional view of the fourth exemplary IC antifuse.

FIG. 27 illustrates a top view of an IC antifuse 2702 having a conductor-insulator-conductor structure according to another aspect of the disclosure. FIG. 28 illustrates a cross-sectional view of the antifuse 2702 along the line 28-28 (see FIG. 27). Similar to the antifuse 1802 shown in FIGS. 18-20, the antifuse 2702 illustrated in FIGS. 27 and 28 includes a top plate 2704, a bottom plate 2106, and a dielectric layer 2108 interposed between the plates 2704, 2106, and the antifuse top plate 2704 has a maximum width $W_{MAX}$ and a maximum length $L_{MAX}$. However, despite having the same maximum width $W_{MAX}$ and maximum length $L_{MAX}$ as the rectangular top plate 1804 of the antifuse depicted in FIGS. 18-20, the top plate 2704 shown in FIG. 27 has a greater total edge length $L_{TE}$ 2701. Moreover, the top plate 2704 has a greater ratio between its total edge length $L_{TE}$ and its top surface area $S_{TP}$ 2705 than the top plate 1804 of FIGS. 18-20.

Referring to FIGS. 27 and 28, the top plate 2704 is electrically coupled to a metal layer 2802 through one or more interconnects 2716 and/or vias 2804. The bottom plate 2106 is similarly connected to the same and/or a different metal layer 2204 through one or more interconnects 2112 and/or vias 2214. A voltage differential applied to the top and bottom plates 2704, 2106 that exceeds the breakdown voltage $V_{BD}$ of the antifuse dielectric layer 2108 causes the antifuse 2702 to transition from an open circuit state to a closed circuit state. The voltage level necessary to transition the antifuse 2702 from the open circuit state to the closed circuit state is the programming voltage $V_{PP}$ of the antifuse 2702.

The antifuse 2702 may also optionally include the one or more bottom metal lines 2114 to, as described above, help reduce the antifuse programming voltage $V_{PP}$ (e.g., the overall breakdown voltage $V_{BD}$ of the antifuse 2702 is lowered). Although FIG. 27 shows three (3) metal lines 2114, any number of bottom metal lines 2114 may be formed underneath the bottom plate 2106. According to one example, the bottom metal lines 2114 may be as wide and/or as long as the top plate 2704. According to another example, the bottom metal lines 2114 may be wider and/or longer than the top plate 2704.

Referring to FIG. 27, the top plate 2704 has a first body portion 2706 and a second body portion 2708. A plurality of fingers 2710 extend out laterally from a first side 2712 of the first body portion 2706. The fingers 2710 also extend out laterally from a second side 2714 of the second body portion thereby coupling the first and second body portions 2706, 2708 to each other. The fingers 2710 may be rectangular and have a length $L_F$ and a width $W_F$, and be spaced apart from one another a distance $W_S$. According to one non-limiting example, $W_S$ may equal $W_F$. According to another non-limiting example, the length $L_F$ may equal $3*W_F$. The fingers 2710 may be positioned such that they are lengthwise perpendicular to the first body portion's first side 2712 and the second body portion's second side 2714. The first body portion 2706 has a length $L_{B1}$ and a width $W_{MAX}$, and the second body portion 2708 has a length $L_{B2}$ and a width $W_{MAX}$. According to one non-limiting example, $L_{B1}$ may equal $L_{B2}$. According to another non-limiting example, $L_{B1}$ may equal $W_F$ and/or $L_{B2}$ may equal $W_F$.

In the illustrated example, the top plate 2704 has four (4) total fingers 2710 and the total edge length $L_{TE}$ 2701 is given by equation (10):

$$L_{TE}=2*(L_{MAX}+W_{MAX})+6*L_F+6*W_S \qquad (10).$$

However, the pattern of the top plate 2704 shown in FIG. 27 is not limited to four (4) fingers 2710 and may have any number of fingers 2710 greater than or equal to two (2). Thus, for a total number of fingers N (where N≥2) the total edge length $L_{TE}$ 2701 is given by equations (11) and (12):

$$L_{TE}=2*L_{B1}+2*L_{B2}+2*N*L_F+2*W_{MAX}+2*(N-1)*W_S \qquad (11);$$

$$L_{TE}=2*(L_{MAX}+W_{MAX})+2*(N-1)*(L_F+W_S) \qquad (12).$$

As described above with respect to FIGS. 19 and 20, a rectangular top plate 1804 having no fingers has a total edge length $L_{TE}=2*(L_{MAX}+W_{MAX})$. Thus, for N total fingers the top plate 2704 of FIGS. 27 and 28 has a total edge length $L_{TE}$ that is greater than the rectangular top plate 1804 by $2*(N-1)*(L_F+W_S)$. For example, if N=4 and $W_F=W_S=L_{B1}=L_{B2}=(\frac{1}{3})*L_F$, then the total edge length $L_{TE}$ of the patterned top plate 2704 is 100% longer than the total edge length $L_{TE}$ for the rectangular top plate 1804 having the same maximum width $W_{MAX}$ and length $L_{MAX}$ (e.g., $W_{MAX}=7*W_F$ and $L_{MAX}=5*W_F$). Therefore, it may be observed that while the top plate's 2704 footprint area has stayed the same at $W_{MAX}*L_{MAX}$, the total edge length $L_{TE}$ has increased by $2*(N-1)*(L_F+W_S)$.

Moreover, as compared to the rectangular top plate 1804, the patterned top plate's 2704 total edge length $L_{TE}$ has increased by $2*(N-1)*(L_F+W_S)$ and its surface area $S_{TP}$ 2705 has decreased by $(N-1)*W_S*L_F$. Therefore the ratio between its total edge length $L_{TE}$ and its surface area $S_{TP}$ has increased.

Figure 29:
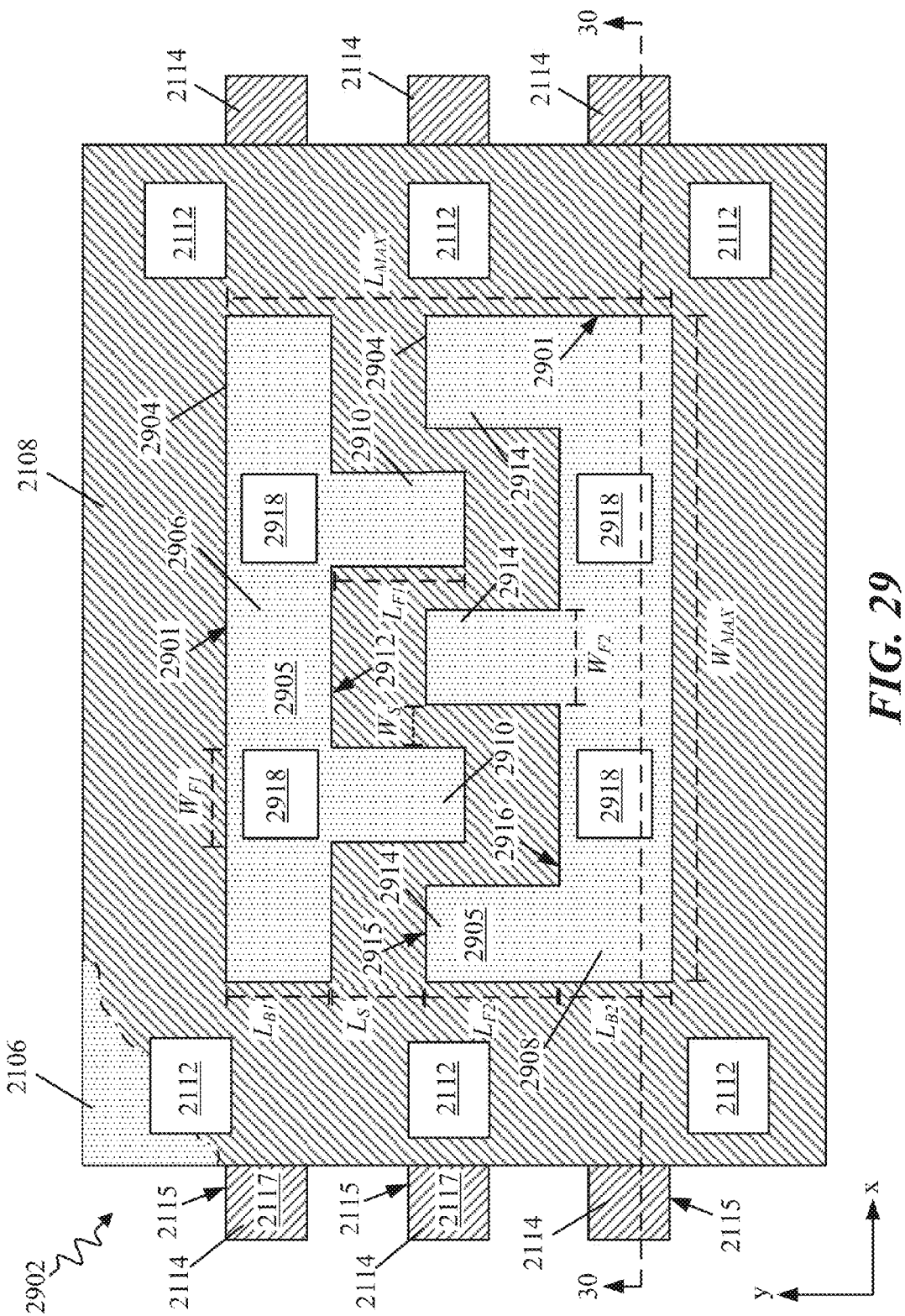
FIG. 29 illustrates a top view of a fifth exemplary IC antifuse having a patterned top conductor plate.
Figure 30:
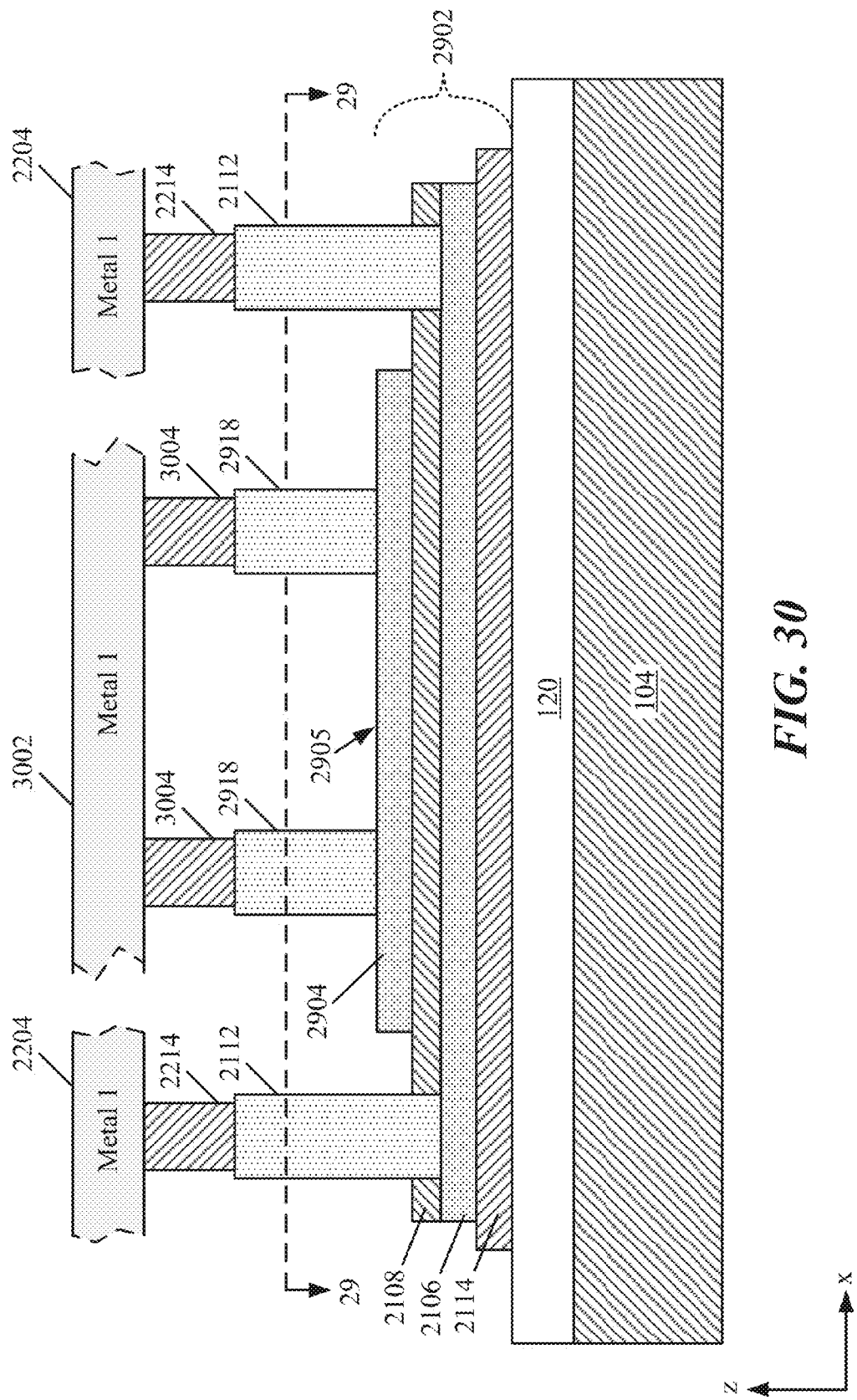
FIG. 30 illustrates a cross-sectional view of the fifth exemplary IC antifuse.

FIG. 29 illustrates a top view of an IC antifuse 2902 having a conductor-insulator-conductor structure according to another aspect of the disclosure. FIG. 30 illustrates a cross-sectional view of the antifuse 2902 along the line 30-30 (see FIG. 29). Similar to the antifuse 1802 shown in FIGS. 18-20, the antifuse 2902 illustrated in FIGS. 29 and 30 includes a top plate 2904, a bottom plate 2106, and a dielectric layer 2108 interposed between the plates 2904, 2106, and the antifuse top plate 2904 has a maximum width $W_{MAX}$ and a maximum length $L_{MAX}$. However, despite having the same maximum width $W_{MAX}$ and maximum length $L_{MAX}$ as the rectangular top plate 1804 of the antifuse depicted in FIGS. 18-20, the top plate 2904 shown in FIG. 29 has a greater total edge length $L_{TE}$ 2901. Moreover, the top plate 2904 has a greater ratio between its total edge length $L_{TE}$ and its top surface area $S_{TP}$ 2905 than the top plate 1804 of FIGS. 18-20.

Referring to FIGS. 29 and 30, the top plate 2904 is electrically coupled to a metal layer 3002 through one or more interconnects 2918 and/or vias 3004. The bottom plate 2106 is similarly connected to the same and/or a different metal layer 2204 through one or more interconnects 2112 and/or vias 2214. A voltage differential applied to the top and bottom plates 2904, 2106 that exceeds the breakdown voltage $V_{BD}$ of the antifuse dielectric layer 2108 causes the antifuse 2902 to transition from an open circuit state to a closed circuit state. The voltage level necessary to transition the antifuse 2902 from the open circuit state to the closed circuit state is the programming voltage $V_{PP}$ of the antifuse 2902.

The antifuse 2902 may optionally also include the one or more bottom metal lines 2114 to, as described above, help reduce the antifuse programming voltage $V_{PP}$ (e.g., the overall breakdown voltage $V_{BD}$ of the antifuse 2902 is lowered). Although FIG. 29 shows three (3) metal lines 2114, any number of bottom metal lines 2114 may be formed underneath the bottom plate 2106. According to one example, the bottom metal lines 2114 may be as wide and/or as long as the top plate 2904. According to another example, the bottom metal lines 2114 may be wider and/or longer than the top plate 2904.

Referring to FIGS. 29 and 30, the top plate 2904 has a first body portion 2906 and a second body portion 2908. The two body portions 2906, 2908 are not directly coupled to one another although they may be electrically coupled to one another through one or more of the interconnects 2918, vias 3004, and/or metal lines 3002. One or more first fingers 2910 extend out laterally from a first side 2912 of the first body portion 2906 toward the second body portion 2908. One or more second fingers 2914 extend out laterally from a second side 2916 of the second body portion 2908 toward the first body portion 2906. The first fingers 2910 may be rectangular and have a length $L_{F1}$ and a width $W_{F1}$, the second fingers 2914 may also be rectangular and have a length $L_{F1}$ and a width $W_{F2}$. The first fingers 2910 may be spaced apart from the second fingers 2914 a distance $W_S$ as shown. The first body portion 2906 may be spaced apart from the second body portion 2908 a distance $L_S$ as shown. That is, the distance between distal edges 2915 of the second plurality of fingers 2914 and the first edge 2912 of the first body portion is $L_S$ as illustrated in FIG. 29. The first fingers 2910 may be positioned such that they are lengthwise perpendicular to the first body portion's first side 2912, and the second fingers 2914 may be positioned such that they are lengthwise perpendicular to the second body portion's second side 2916. The first body portion 2906 has a length $L_{B1}$ and a width $W_{MAX}$, and the second body portion 2908 has a length $L_{B2}$ and a width $W_{MAX}$. According to one aspect, the second body portion 2908 has one (1) more finger 2914 than the number of fingers 2910 of the first body portion 2906, and thus the second body portion 2908 has at least two (2) or more fingers 2914.

According to some non-limiting examples: $W_{F1}$ may equal $W_{F2}$; $L_{F1}$ may equal $L_{F2}$; $W_S$ may equal $0.5*W_{F1}$ and/or $0.5*W_{F2}$; $L_S$ may equal $0.5*W_{F1}$ and/or $0.5*W_{F2}$; $L_{B1}$ may equal $L_{B2}$; $L_{B1}$ and/or $L_{B2}$ may equal $W_{F1}$ and/or $W_{F2}$; $L_{F1}$ may equal $2*W_{F1}$; and/or $L_{F2}$ may equal $2*W_{F2}$.

In the illustrated example, the top plate 2904 has five (5) fingers 2910, 2914 and the total edge length $L_{TE}$ 2901 is given by equation (13):

$$L_{TE}=2*L_{B1}+2*L_{B2}+4*L_{F1}+6*L_{F2}+2*W_{MAX}+4*W_{F1}+6*W_{F2}+8*W_S \quad (13).$$

However, the pattern of the top plate 2904 shown in FIG. 29 is not limited to five (5) fingers 2910, 2914 and may have any number of fingers 2910, 2914 greater than or equal to three (3), assuming the second body portion 2908 has one (1) more finger 2914 than the first body portion 2906. Thus, for a total number of fingers N (where N≥3) the total edge length $L_{TE}$ 2901 is given by equation (14):

$$L_{TE}=2*L_{B1}+2*L_{B2}+(N-1)*L_{F1}+(N+1)*L_{F2}+2*W_{MAX}+(N-1)*W_{F1}+(N+1)*W_{F2}+2*(N-1)*W_S \quad (14).$$

And if it is assumed that $L_S=0.5*L_{F1}=0.5*L_{F2}$, then the total edge length $L_{TE}$ may also be represented by equation (15):

$$L_{TE}2*(L_{MAX}+W_{MAX})+(N+2)*L_{F1}+(N-1)*L_{F2}+(N-1)*W_{F1}+(N+1)*W_{F2}+2*(N-1)*W_S \quad (15).$$

As described above with respect to FIGS. 19 and 20, a rectangular top plate 1804 having no fingers has a total edge length $L_{TE}=2*(L_{MAX}+W_{MAX})$. Thus, for N total fingers the top plate 2904 of FIGS. 29 and 30 has a total edge length $L_{TE}$ that is greater than the rectangular top plate 1804 by $(N-2)*L_{F1}+(N-1)*L_{F2}+(N-1)*W_{F1}+(N+1)*W_{F2}+2*(N-1)*W_S$. For example, if N=5 and $W_{F1}=W_{F2}=2*W_S=L_{B1}=L_{B2}=0.5*L_{F1}=0.5*L_{F2}$, then the total edge length $L_{TE}$ of the patterned top plate 2904 is 116% longer than the total edge length $L_{TE}$ for the rectangular top plate 1804 having the same maximum width $W_{MAX}$ and length $L_{MAX}$ (e.g., $W_{MAX}=7*W_F$ and $L_{MAX}=5*W_F$). Therefore, it may be observed that while the top plate's 2904 footprint area has stayed the same at $W_{MAX}*L_{MAX}$, the total edge length $L_{TE}$ has increased by $(N-2)*L_{F1}+(N-1)*L_{F2}+(N-1)*W_{F1}+(N+1)*W_{F2}+2*(N-1)*W_S$, which is equal to $6*(N-1)*W_{F1}$ for $W_{F1}=W_{F2}=2*W_S=L_{B1}=L_{B2}=0.5*L_{F1}=0.5*L_{F2}$.

Moreover, as compared to the rectangular top plate 1804, the patterned top plate's 2904 total edge length $L_{TE}$ has increased by $(N-2)*L_{F1}+(N-1)*L_{F2}+(N-1)*W_{F1}+(N-1)*W_{F2}+2*(N-1)*W_S$ and its surface area $S_{TP}$ 2905 has decreased by $0.5*(N-1)*W_{F1}*L_S+(N-1)*(L_S+L_{F2})*W_S+0.5*(N+1)*W_{F2}*L_S$. Therefore the ratio between its total edge length $L_{TE}$ and its surface area $S_{TP}$ has increased.

FIG. 31 illustrates a method of manufacturing an integrated circuit. First, a substrate is provided 3102. Next, an antifuse is formed on the substrate 3104. This includes first forming a bottom conductor plate on the substrate 3106. Second, a dielectric layer is formed above the bottom conductor plate 3108. Third, a top conductor plate is formed above the dielectric layer, where the top conductor plate has a maximum width $W_{MAX}$, a maximum length $L_{MAX}$, and a total edge length $L_{TE}$ according to an equation given by $L_{TE}>2*(W_{MAX}+L_{MAX})$ 3110.

According to one aspect, at least one metal line is formed below the bottom conductor plate. The metal line may include an edge hump along its edges that causes irregularity and/or surface roughness in at least a portion of the dielectric layer above it. According to another aspect, a plurality of metal lines are formed below the bottom conductor plate. The metal lines are oriented parallel to one another and each metal line has a length greater than at least one of the maximum length $L_{MAX}$ and/or the maximum width $W_{MAX}$ of the top conductor plate.

In performing the method of manufacturing steps described above, processes known in the art may be used to perform these steps, such as but not limited to photolithography, ion implantation, dry etching, wet etching, thermal treatments, chemical vapor deposition, physical vapor deposition, molecular beam epitaxy, CMP, etc.

Figure 32:
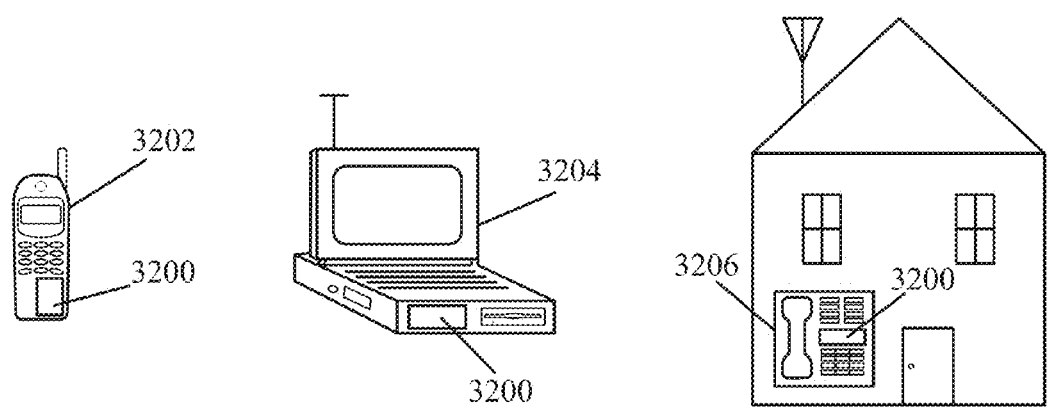
FIG. 32 illustrates various electronic devices that may include ICs having patterned top conductor plates.

FIG. 32 illustrates various electronic devices that may include an integrated circuit 3200 according to one aspect. The integrated circuit 3200 may include any one of the antifuses 2102, 2402, 2502, 2702, 2902 described herein. For example, a mobile telephone 3202, a laptop computer 3204, and a fixed location terminal 3206 may include the integrated circuit 3200. The devices 3202, 3204, 3206 illustrated in FIG. 32 are merely exemplary. Other electronic devices may also feature the integrated circuit 3200 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, and/or 32 may be rearranged and/or combined into a single component, step, feature or function or embodied in several components, steps, or functions. Additional elements, components, steps, and/or functions may also be added without departing from the invention.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. An integrated circuit, comprising:
an antifuse having a conductor-insulator-conductor structure, the antifuse comprising
a top conductor plate,
a dielectric layer,
a bottom conductor plate, the dielectric layer interposed between the top and bottom conductor plates, and at least one metal line comprising a surface irregularity, positioned under the bottom conductor plate, the surface irregularity being configured to cause weakness in at least the bottom conductor plate to lower a dielectric breakdown voltage $V_{BD}$ of the antifuse, wherein the antifuse configured to transition from an open circuit state to a closed circuit state if a programming voltage $V_{pp}$ greater than or equal to the $V_{BD}$ of the antifuse is applied to the top conductor plate and the bottom conductor plate, and wherein the top conductor plate has a maximum width $W_{MAX}$ and a maximum length $L_{MAX}$, and the top conductor plate has a total edge length $L_{TE}$ according to an equation given by $$L_{TE} > 2*(W_{MAX} + L_{MAX}).$$

2. The integrated circuit of claim 1, wherein the top conductor plate includes a first body portion having a first side, and a first plurality of fingers extending laterally from the first side of the first body portion, the first plurality of fingers each being rectangular and having a length $L_F$ and positioned perpendicular lengthwise to the first side of the first body portion.

3. The integrated circuit of claim 2, wherein a number of the first plurality of fingers is equal to N, and the total edge length $L_{TE}$ of the top conductor plate is given by an equation $$L_{TE} = 2*(W_{WAX} + L_{MAX}) + 2*(N-1)*L_F.$$

4. The integrated circuit of claim 2, wherein the top conductor plate further includes a second plurality of fingers extending laterally from a second side of the first body portion, the second side of the first body portion opposite the first side of the first body portion, the second plurality of fingers each being rectangular and having a length $L_F$ and positioned perpendicular lengthwise to the second side of the first body portion.

5. The integrated circuit of claim 4, wherein a number of the first plurality of fingers is equal to a number of the second plurality of fingers and the total number of the first and second plurality of fingers is equal to N, and the total edge length $L_{TE}$ of the top conductor plate is given by an equation $$L_{TE} = 2*(W_{MAX} + L_{MAX}) + 2*(N-2)*L_F.$$

6. The integrated circuit of claim 4, wherein a number of the first plurality of fingers is greater than a number of the second plurality of fingers and the total number of the first and second plurality of fingers is odd and equal to N, and the total edge length $L_{TE}$ of the top conductor plate is given by an equation $$L_{TE} = 2*(W_{MAX} + L_{MAX}) + 2*(N-2)*L_F.$$

7. The integrated circuit of claim 2, wherein the top conductor plate further includes a second body portion having a second side, and the first plurality of fingers also extend laterally from the second side of the second body portion to couple the first and second body portions to each other.

8. The integrated circuit of claim 7, wherein a number of the first plurality of fingers is equal to N, the first plurality of fingers are spaced apart a distance $W_S$, and the total edge length $L_{TE}$ of the top conductor plate is given by an equation $$L_{TE} = 2*(W_{MAX} + L_{MAX}) + 2*(N-1)*(L_F + W_S).$$

9. The integrated circuit of claim 2, wherein the top conductor plate further includes a second body portion having a second plurality of fingers, the first body portion not directly coupled to the second body portion.

10. The integrated circuit of claim 9, wherein the second body portion has a second side, and the second plurality of fingers extend laterally from the second side of the second body portion towards the first body portion, the second plurality of fingers each being rectangular and having a length $L_{F2}$ and positioned perpendicular lengthwise to the second side of the second body portion, and a distance between a distal edge of the second plurality of fingers and a first edge of the first body portion is $L_S$.

11. The integrated circuit of claim 10, wherein a number of the first plurality of fingers is one (1) less than a number of the second plurality of fingers and the total number of the first and second plurality of fingers is odd and equal to N, the distance $L_S$ is equal to about half the length $L_F$ and the length $L_{F2}$ ($L_S = 0.5*L_F = 0.5*L_{F2}$), and the total edge length $L_{TE}$ of the top conductor plate is given by an equation $$L_{TE} = 2*(L_{MAX} + W_{MAX}) + (N-2)*L_F + (N-1)*L_{F2} + (N-1)*W_{F1} + (N+1)*W_{F2} + 2*(N-1)*W_S,$$

wherein $W_{F1}$ represents a width of the first plurality of fingers, $W_{F2}$ represents a width of the second plurality of fingers, and $W_S$ represents a space between the first plurality of fingers and the second plurality of fingers.

12. The integrated circuit of claim 1, wherein the at least one metal line is configured with an edge hump along its edges to cause a surface irregularity in at least a portion of the dielectric layer.

13. The integrated circuit of claim 1, wherein the at least one metal line comprises a plurality of metal lines oriented parallel to one another and having a length greater than at least one of the maximum length $L_{MAX}$ and/or the maximum width $W_{MAX}$ of the top conductor plate.

14. An integrated circuit, comprising:
an antifuse comprising
a top conductor plate,
a dielectric layer,
a bottom conductor plate, the dielectric layer interposed between the top and bottom conductor plates, and
a plurality of metal lines comprising surface irregularities positioned under the bottom conductor plate, the surface irregularities being configured to cause weakness in at least the bottom conductor plate to lower a dielectric breakdown voltage $V_{BD}$ of the antifuse, wherein the antifuse configured to transition from an open circuit state to a closed circuit state if a programming voltage $V_{pp}$ greater than or equal to the $V_{BD}$ of the antifuse is applied between the top conductor plate and the bottom conductor plate, and wherein the top conductor plate has a maximum width $W_{MAX}$ along a first axis, and a maximum length $L_{MAX}$ along a second axis, the first axis and the second axis perpendicular to one another, and the top conductor plate has a total edge length $L_{TE}$ according to an equation given by $$L_{TE} > 2*(W_{MAX} + L_{MAX}),$$

and the top conductor plate has a top surface having an area $S_{TP}$ that is less than $W_{MAX}*L_{MAX}$.

15. The integrated circuit of claim 14, wherein the top conductor plate is positioned above the bottom conductor plate, and wherein the plurality of metal lines are oriented parallel to one another and having a length greater than at least one of the maximum length $L_{MAX}$ and/or the maximum width $W_{MAX}$ of the top conductor plate.

16. The integrated circuit of claim 15, wherein at least one of the plurality of metal lines is configured with an edge hump along its edges to cause a surface irregularity in at least a portion of the dielectric layer.

17. The integrated circuit of claim 15, wherein the top conductor plate includes a first body portion having a first side, and a first plurality of fingers extending laterally from the first side of the first body portion.

18. The integrated circuit of claim 17, wherein the top conductor plate further includes a second plurality of fingers extending laterally from a second side of the first body portion, the second side of the first body portion opposite the first side of the first body portion.

19. The integrated circuit of claim 17, wherein the top conductor plate further includes a second body portion having a second side, and the first plurality of fingers also extend laterally from the second side of the second body portion to couple the first and second body portions to each other.

20. The integrated circuit of claim 17, wherein the top conductor plate further includes a second body portion having a second side, and a second plurality of fingers extend laterally from the second side of the second body portion towards the first body portion.

* * * * *